United States Patent [19]

Fitzpatrick

[11] Patent Number: 4,575,823
[45] Date of Patent: Mar. 11, 1986

[54] ELECTRICALLY ALTERABLE NON-VOLATILE MEMORY

[75] Inventor: Michael D. Fitzpatrick, Linthicum, Md.

[73] Assignee: Westinghouse Electric Corp., Pittsburgh, Pa.

[21] Appl. No.: 409,002

[22] Filed: Aug. 17, 1982

[51] Int. Cl.$^4$ .................. G11C 7/00; G11C 11/40
[52] U.S. Cl. ............................... 365/184; 365/205; 365/218; 365/189
[58] Field of Search ............ 365/189, 184, 185, 205, 365/207, 208, 218; 357/23.5

[56] References Cited

U.S. PATENT DOCUMENTS

| | | | |
|---|---|---|---|
| 3,702,466 | 11/1972 | Nakagiri et al. | 365/184 |
| 3,702,990 | 11/1972 | Ross | 365/184 |
| 3,760,378 | 9/1973 | Burns | 365/184 |
| 4,090,258 | 5/1978 | Cricchi | 365/184 |
| 4,149,270 | 4/1979 | Cricchi | 365/184 |
| 4,170,741 | 10/1979 | Williams | 365/205 |
| 4,193,128 | 3/1980 | Brewer | 365/184 |

FOREIGN PATENT DOCUMENTS 2025130 1/1980 United Kingdom ............... 365/184

Primary Examiner—Stuart N. Hecker
Assistant Examiner—Glenn A. Gossage
Attorney, Agent, or Firm—W. G. Sutcliff

[57] ABSTRACT

A non-volatile memory and method is described incorporating an array of variable threshold transistors, a row decoder, a buffer circuit positioned between the array and row decode circuitry, column decode circuitry, and a sense amplifier. The non-volatile memory overcomes the problem of high voltages in the memory array during READ operation. During READ operation the variable threshold transistors operate in the common source mode. A buffer circuit with level shift capability is described incorporating P and N channel transistors. A sense amplifier with decoupling during sensing or lock out is described incorporating P and N channel transistors.

21 Claims, 18 Drawing Figures

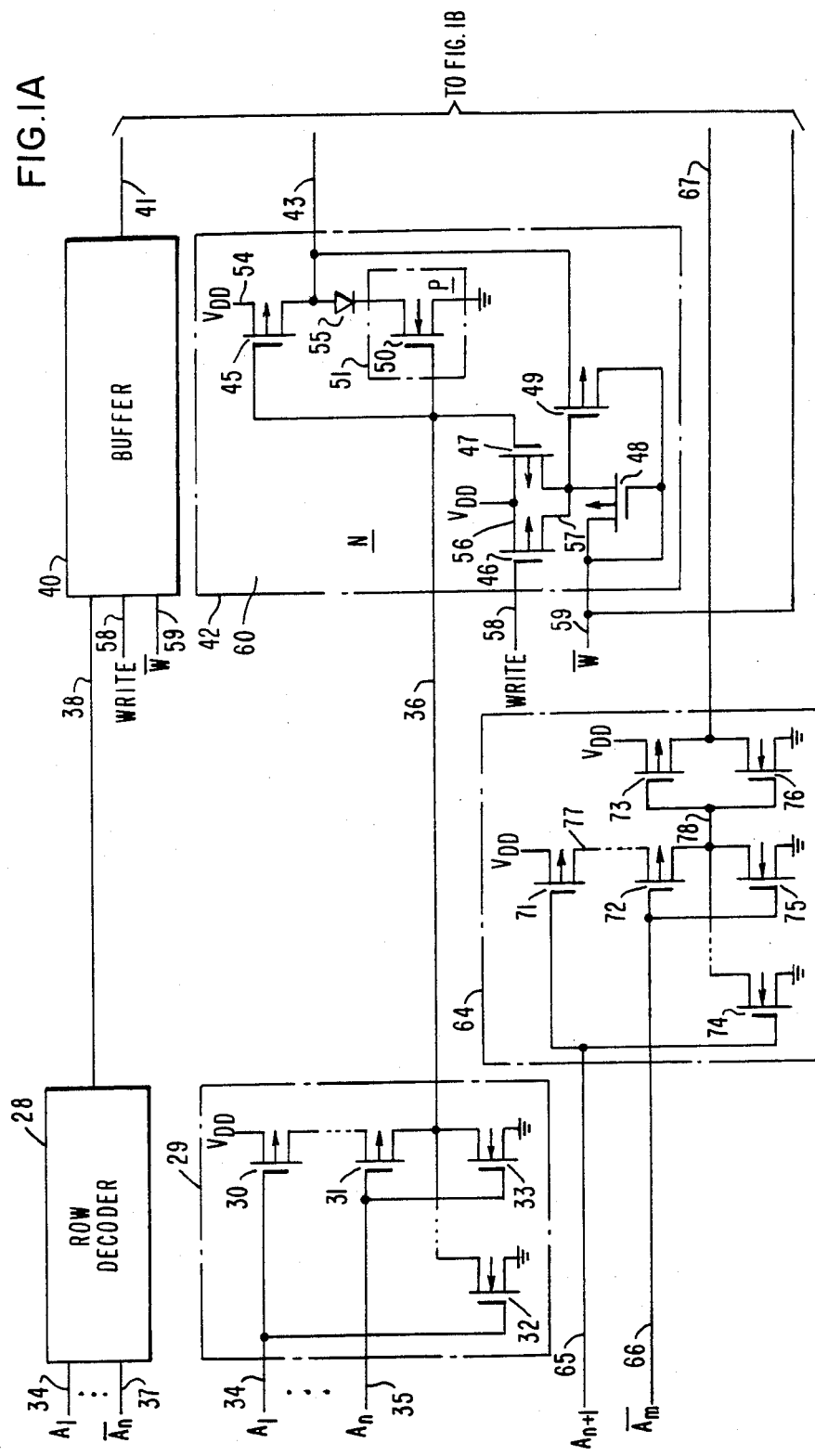

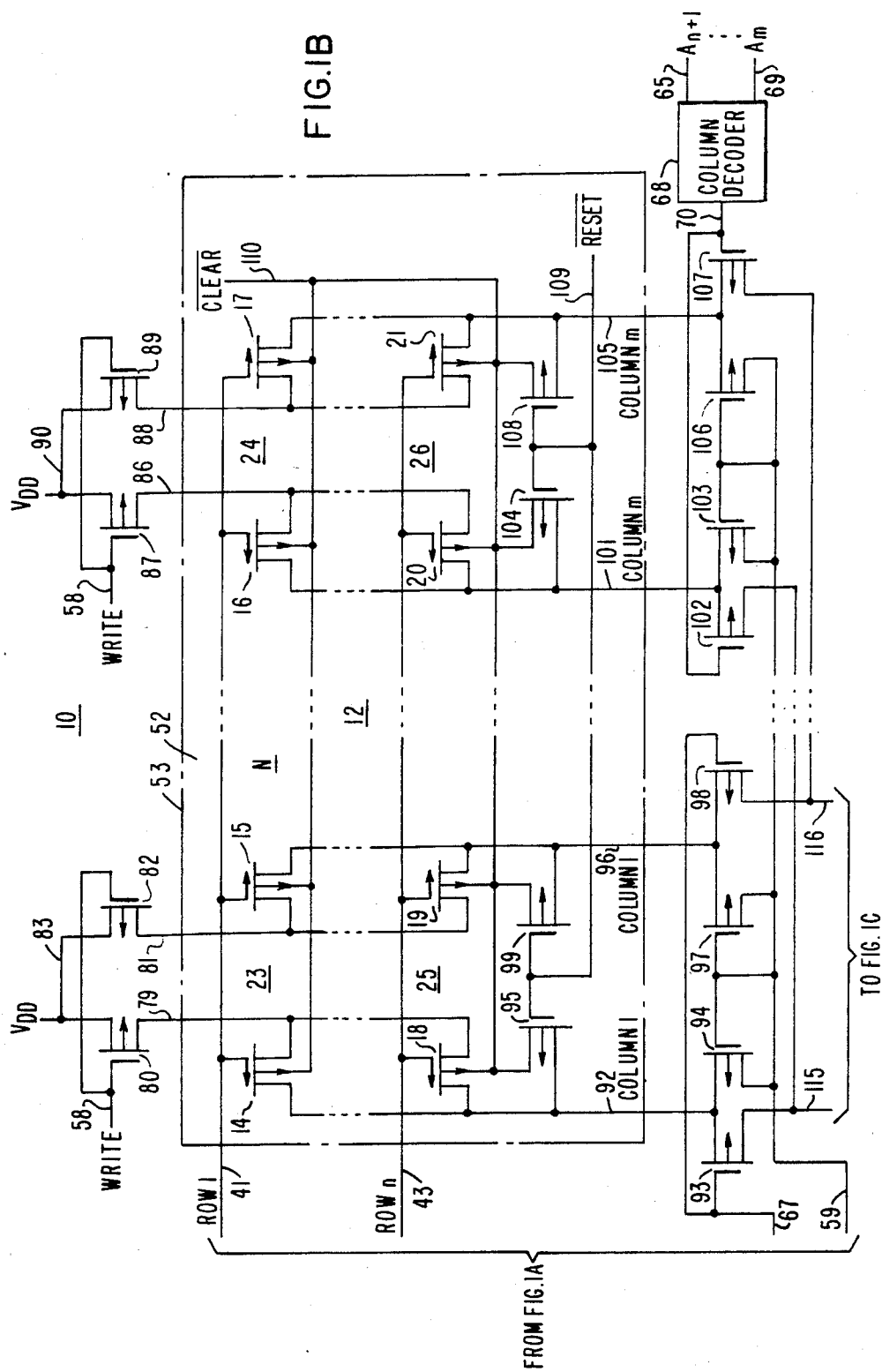

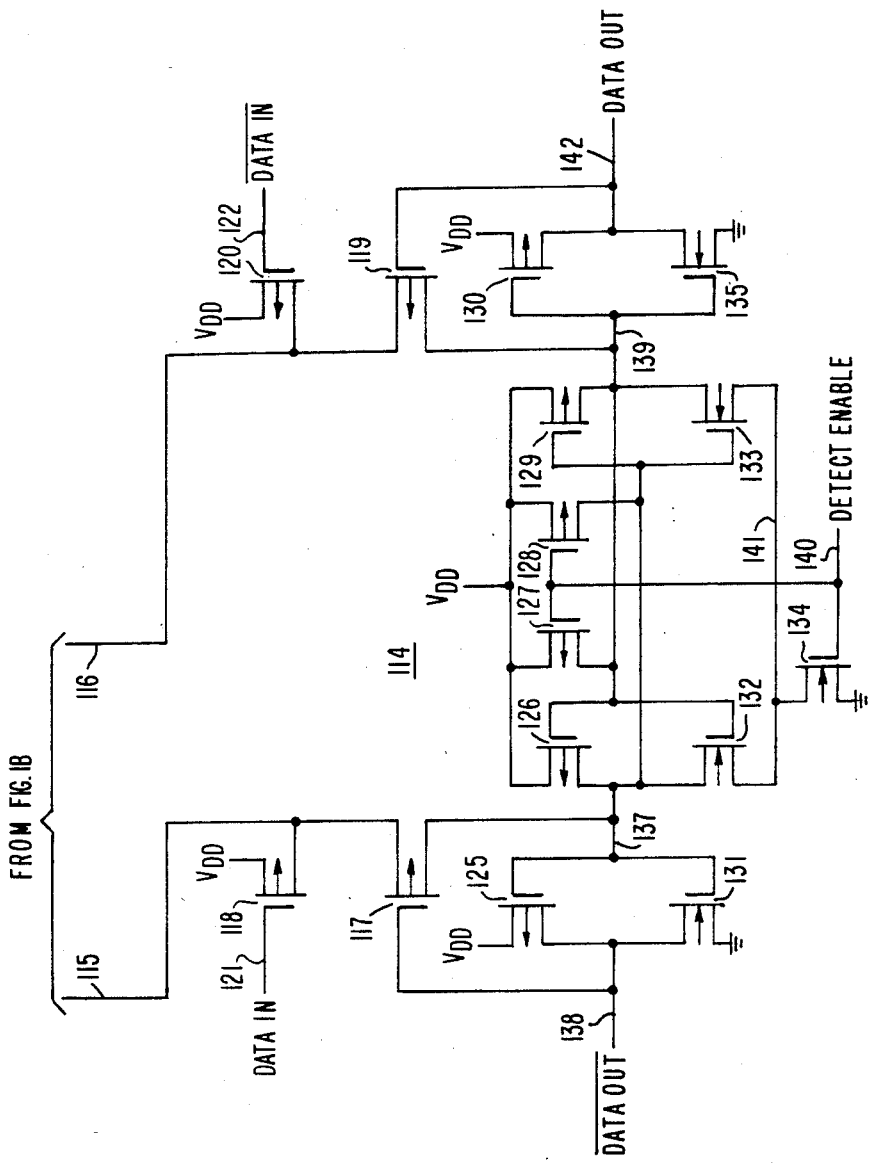
FIG. IC

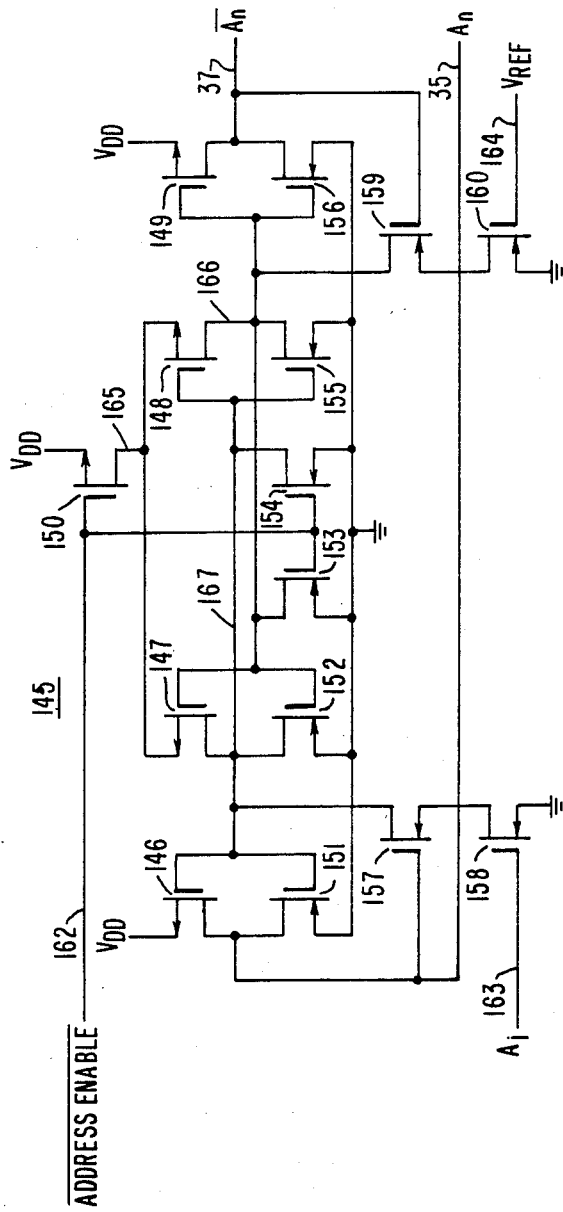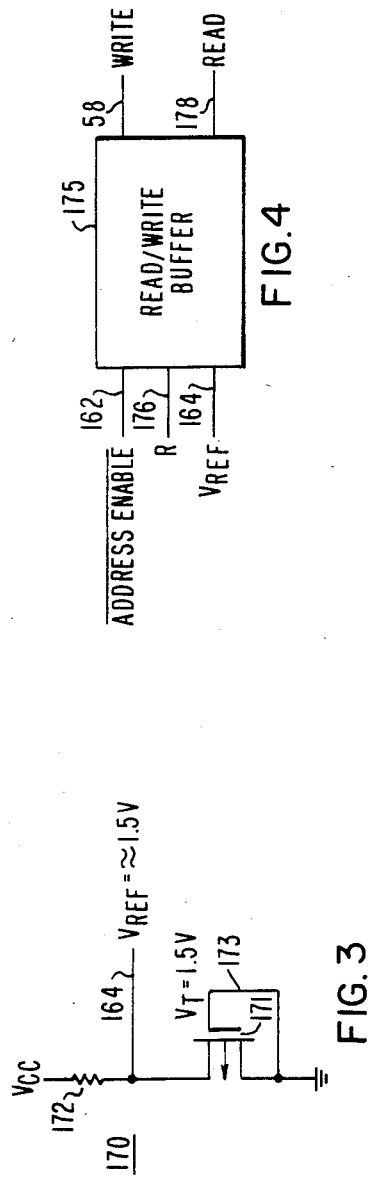

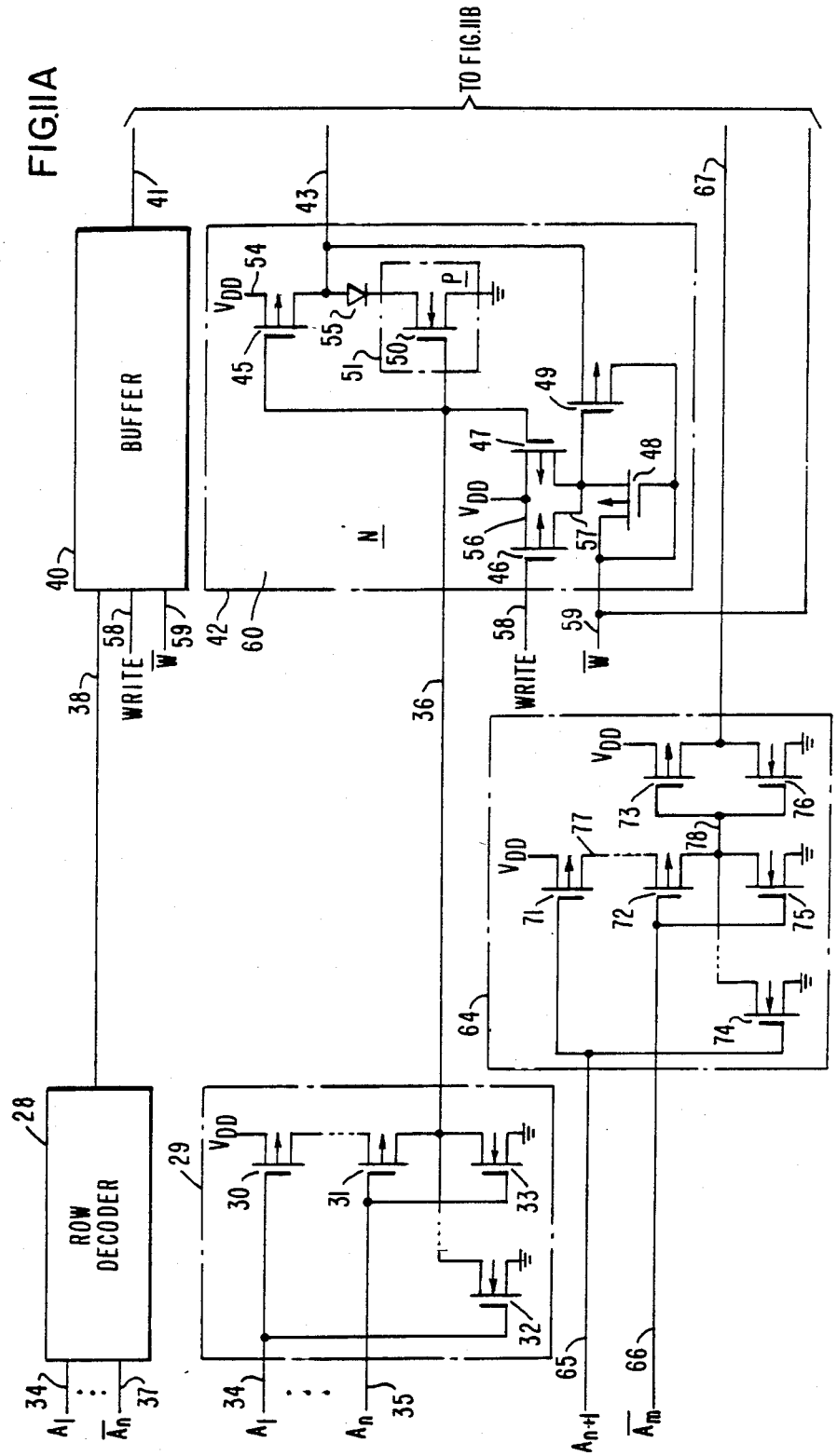

ELECTRICALLY ALTERABLE NON-VOLATILE MEMORY

CROSS-REFERENCE TO A RELATED APPLICATION

This application is cross-referenced to an application entitled "Enhancement Mode Limited MNOS Memory Device" by J. R. Cricchi having Ser. No. 039,223, filed on May 14, 1979, now abandoned, which is a continuation of Ser. No. 219,463, filed on Jan. 20, 1972, also now abandoned, which describes a metal nitride oxide semiconductor memory device and a memory system utilizing an array of the devices.

BACKGROUND OF THE INVENTION

1. Field of the Invention

This invention relates to semiconductor memories, particularly to non-volatile memories using variable threshold transistors.

2. Description of the Prior Art

Electrically alterable non-volatile memories may comprise an array of variable threshold transistors, address circuitry to access individual transistors within the array, and sense amplifiers to detect the threshold state of accessed transistors. An electrically alterable non-volatile memory may be a random access memory or an electrically alterable read-only-memory. A random access memory has comparable read and write times for entering and withdrawing information from any word in the memory, whereas an electrically alterable read-only-memory has short read times to any word and much longer write times. In an electrically alterable read-only-memory, information is normally written into the array once and then read out many times.

In an electrically alterable read-only-memory the contents within the array may be altered on a word-by-word basis or the entire contents may be erased to one memory state and selected bits of the memory rewritten to the second memory state on a word by word basis.

One example of an electrically alterable non-volatile memory is described in U.S. Pat. No. 4,160,291 which issued on July 3, 1979, entitled "Pre-Charge Circuitry for an Electrically Alterable Non-Volatile Memory" by P. C. Smith and J. L. Fagan and assigned to the assignee herein. In U.S. Pat. No. 4,160,291, P channel circuitry was used to implement the address row and column decoders as well as the sense amplifier. The voltages required to operate the memory as shown in FIGS. 2A and 2B required voltage swings during read operation of 0 to $-25$ volts and 0 to $-30$ volts as shown in FIG. 8.

A random access non-volatile memory was described in U.S. Pat. No. 4,090,258, which issued on May 16, 1978, entitled "MNOS Non-Volatile Memory with Write Cycle Suppression" to J. R. Cricchi and assigned to the assignee herein. In U.S. Pat. No. 4,090,258 two variable threshold transistors were shown to comprise a memory cell each written to the opposite threshold state. During read operation a sense amplifier was coupled to the source of each of the two transistors in the memory cell that was being addressed.

Instead of electrically altering a non-volatile memory, some designs have utilized ultraviolet light to erase the non-volatile transistors to one memory state followed by electrically rewriting selected bits of each word of the memory to the second memory state. One example of an ultraviolet erasable read-only-memory is described in an article entitled "Single-Supply Erasable PROM Saves Power with C-MOS Process" by G. Ramachandran, which appearred in Electronics Magazine, July 6, 1978, pages 106–111. At page 108 in FIG. 3 an address register is shown which uses complementary metal oxide semiconductor circuitry to provide speed and low power. The memory transistor shown in the Figures on page 107 uses a floating silicon gate which holds charge to alter the threshold voltage of the transistor.

The speed from which data can be read out of an array of non-volatile memory transistors depends in part upon the sense amplifier used. Several sense amplifiers have been perfected for use with variable threshold transistors. On such sense amplifier is described in U.S. Pat. No. 4,139,911, which issued on Feb. 13, 1979 entitled "High Speed Sense Circuit for Semiconductor Memories" by F. M. Sciulli and D. W. Williams which is assigned to the assignee herein and which describes a high-speed sensing circuit utilizing all P channel transistors coupled to the source of the memory transistors in the array.

In U.S. Pat. No. 4,170,741 which issued on Oct. 9, 1979, entitled "High Speed CMOS Sense Circuit for Semiconductor Memories" by D. W. Williams and assigned to the assignee herein, a high-speed sense circuit utilizing complementary metal oxide semiconductor transistors is shown coupled to the source of the variable threshold transistors in the memory array.

The typical method for reading data out from an array of metal nitride oxide semiconductor transistors was to set the drain of the transistors to a negative voltage and allow the source of the selected transistor to follow the gate bias voltage by a threshold voltage $V_T$ away. This is normally termed the source follower mode. As the gate-to-source voltage approaches $V_T$ as the source voltage is being pulled down to $V_{GS}$ equals $V_T$, less current passes through the transistor which results in discharging the node capacitances slowly.

It is therefore desirable to provide an electrically alterable non-volatile memory which uses CMOS circuitry to reduce the power.

It is further desirable to provide a sense amplifier which responds quickly to the output of selected transistors in a non-volatile memory array.

It is further desirable to provide a sense amplifier which decouples the sense amplifier from the non-volatile memory array after initial sensing.

It is further desirable to operate a non-volatile memory array at reduced voltages during read operation.

It is further desirable to provide an array of metal nitride oxide semiconductor transistors with the selected transistor during read operation having a constant gate-to-source voltage $V_{GS}$ and operating in the common source mode.

It is further desirable to provide circuitry for writing into an array of metal nitride oxide semiconductor transistors which minimizes the amount of circuitry subjected to high voltages during write operation.

SUMMARY OF THE INVENTION

In accordance with the present invention, an electrically alterable non-volatile memory and method for storing and retrieving information is described comprising an array of variable threshold transistors, each having a source, drain and gate electrode, means for placing a voltage on the source of the variable threshold transistors in the array, means for placing a first predetermined voltage on the gate of non-selected transistors within the array, means for placing a second predetermined voltage on the gate of a selected transistor in the array, and means for sensing the current passing through the selected transistor.

The invention further provides for deselecting the selected row upon receipt of a signal from the sense amplifier indicative that the data from the desired transistor has been sensed.

The invention further provides a buffer circuit responsive to logic levels from a CMOS decoder and which can level shift one logic level to a write voltage during write operation and at other times provides no level shift.

The invention further provides a sense amplifier with a decoupling or lock out means to disconnect the capacitance of the memory elements on the line being sensed after initial sensing to permit rapid latching of the sense amplifier.

BRIEF DESCRIPTION OF THE DRAWING

FIGS. 1A, 1B and 1C together show one embodiment of the invention;

FIG. 2 is a schematic diagram of an address buffer;

FIG. 3 is a schematic diagram of a reference voltage generator;

FIG. 4 is a block diagram of a read/write buffer;

FIGS. 11A, 11B and 11C together show an alternate embodiment of the invention;

DESCRIPTION OF THE PREFERRED EMBODIMENT

Figure 5:
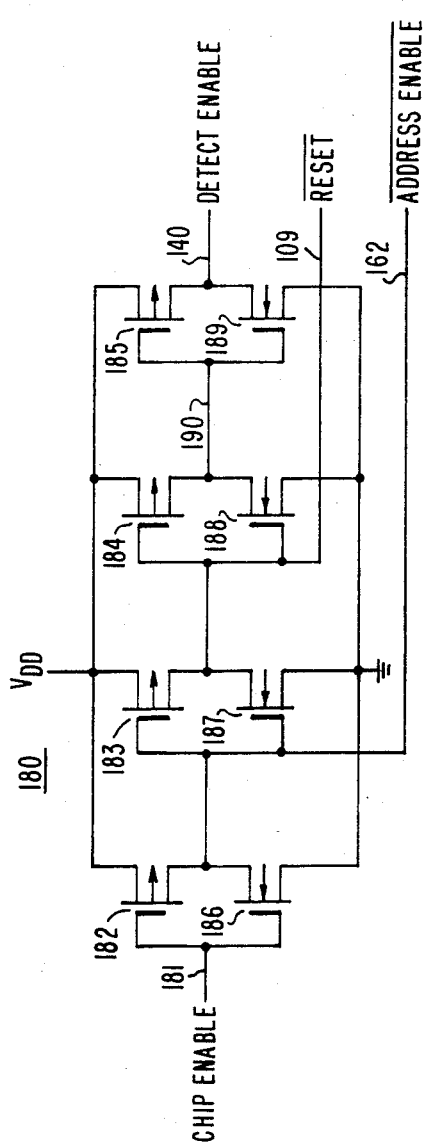
FIG. 5 is a schematic diagram of a timing generator.

Referring to the drawing and in particular to FIGS. 1A through 1C, an electrically alterable non-volatile memory 10 is shown including an array of variable threshold transistors 12. Array 12 comprises variable threshold transistors 14–21. In array 12 two variable threshold transistors are used for each memory cell or bit location for storing information. Memory cell 23 comprises transistors 14 and 15. Memory cell 24 comprises transistors 16 and 17. Memory cell 25 comprises transistors 18 and 19. Memory cell 26 comprises transistors 20 and 21. Memory cells 23–26 are arranged in rows and columns. Row 1 comprises memory cells 23 and 24 and row n comprises memory cells 25 and 26. Column 1 comprises memory cells 23 and 25. Column m comprises memory cells 24 and 26. Row 1 of array 12 is selected by row decoder 28 having address inputs $A_I$ to $A_n$ which may be true or complement. Row n is selected by row decoder 29 also having address inputs $A_I$ to $A_n$. Row decoder 29 is comprised of transistors 30 and 31 which are P channel and transistors 32 and 33 which are N channel. When address signals $A_I$ to $A_n$ are low, such as 0 volts, on lines 34 and 35, the output on line 36 is high such as a voltage $V_{DD}$. Voltage supply $V_{DD}$ may for example be in the range from 5 to 12 volts.

Row decoder 28 may be implemented with the same CMOS circuitry as shown for row decoder 29. The output of row decoder 28 is coupled over line 38 to an input of buffer circuit 40. The output of buffer circuit 40 is coupled over lead 41 to the gate electrode of each transistor in row 1, transistors 14–17. The output of buffer circuit 42 is coupled over lead 43 to the gate electrode of each transistor in row n, transistors 18–21.

Buffer circuit 42 comprises transistors 45–49 which may be P-type transistors and transistor 50 which may be N-type. Transistor 50 may be fabricated in a P region 51 within N region 60. P channel transistors 45–49 may be formed in N region 60 which is electrically isolated from N region 52 such as by a P region therebetween or by dielectric isolation. The source of transistor 45 is coupled over line 54 to voltage supply $V_{DD}$. Lead 36 is coupled to the gate of transistors 45, 47 and 50. The drain of transistor 45 is coupled over lead 43 to the anode of diode 55 and the source of transistor 49. The source of transistor 50 is coupled to ground potential. The source of transistors 46 and 47 are coupled over lead 56 to voltage supply $V_{DD}$. The drain of transistors 46 and 47 are coupled over lead 57 to the gate of transistor 49 and the source of transistor 48. Control signal WRITE is coupled over lead 58 to the gate of transistor 46. The control signal $\overline{W}$ is coupled over lead 59 to the gate and drain of transistor 48 and to the drain of transistor 49.

In operation, when row n is selected the output of row decoder 29 is high causing transistor 50 to turn on and transistor 45 to be turned off resulting in line 43 being pulled low to about 0 volts because the voltage drop across diode 55 is about 0 volts when the current is zero. Transistor 47 is turned off. Control signal WRITE is low causing transistor 46 to be turned on causing line 57 to be pulled high to voltage supply $V_{DD}$. Transistor 49 is turned off. During read operation control signal $\overline{W}$ would be high causing transistor 48 to be turned off. If row n is not selected according to the addresses $A_I$-$A_n$, then the output of row decoder 29 will be low causing transistor 45 to be conducting pulling line 43 high to voltage $V_{DD}$. Transistor 47 will be turned on causing lead 57 to be pulled high causing transistor 49 to be turned off. Since during read operation control signal WRITE will be low, transistor 46 will also be conducting also pulling line 57 high. Since $\overline{W}$ will be high, transistor 48 will be non-conducting.

Column decoder 64 functions to decode address signals $A_{n+I}$ to $\overline{A}_m$ on lines 65 and 66 respectively to provide an output on lead 67 which is low at times column 1 of array 12 is selected. If column 1 is not selected then lead 67 will be high. Row decoder 68 functions to respond to address signals $A_{n+I}$ through $A_m$ on lines 65 and 69 respectively to provide an output on lead 70 which is low at times column m is selected.

Column decoder 64 includes transistors 71–73 which may be P-type and transistors 74–76 which may be N-type to form a CMOS column decoder. Lead 65 is coupled to the gate of transistors 71 and 74. Lead 66 is coupled to the gate of transistors 72 and 75. The source of transistors 71 and 73 are coupled to voltage supply $V_{DD}$. The drain of transistor 71 is coupled to the source of transistor 72 over lead 77. The drain of transistors 72, 74 and 75 are coupled over lead 78 to the gate of transistors 73 and 76. The source of transistors 74–76 are coupled to ground potential. The drain of transistor 73 is coupled over lead 67 to the drain of transistor 76. Column decoder 68 may be constructed with similar circuitry as column decoder 64.

The source of transistors 14 and 18 in column 1 are coupled over lead 79 to the drain of transistor 80. The source of transistors 15 and 19 in column 1 are coupled over lead 81 to the drain of transistor 82. The source of transistors 80 and 82 are coupled over lead 83 to voltage supply $V_{DD}$. The gate of transistors 80 and 82 are coupled over lead 58 to control signal WRITE.

The source of transistors 16 and 20 of column m are coupled over lead 86 to the drain of transistor 87. The source of transistors 17 and 21 of column m are coupled over lead 88 to the drain of transistor 89. The source of transistors 87 and 89 are coupled over lead 90 to voltage supply $V_{DD}$. The gate of transistors 87 and 89 are coupled over lead 58 to control signal WRITE.

The drain of transistor 14 and 18 of column 1 are coupled over lead 92 to the source of transistors 93 and 94 and to the drain of transistor 95. The drain of transistors 15 and 19 of column 1 are coupled over lead 96 to the source of transistors 97 and 98 and to the drain of transistor 99. The drain of transistors 16 and 20 of column m are coupled over line 101 to the source of transistors 102 and 103 and to the drain of transistor 104. The drain of transistors 17 and 21 of column m are coupled over lead 105 to the source of transistors 106 and 107 and to the drain of transistor 108. The gate of transistors 95, 99, 104 and 108 are coupled over lead 109 to control signal $\overline{RESET}$. The body of the variable threshold transistors 14–21 are coupled in common over lead 110 to control signal $\overline{CLEAR}$ and to the source of transistors 95, 99, 104 and 108. Control signal $\overline{W}$ is coupled over lead 59 to the gate and drain of transistors 94, 97, 103 and 106. Lead 67 from column decoder 64 is coupled to the gate of transistors 93 and 98. Lead 70 from column decoder 68 is coupled to the gate of transistor 102 and 107.

Sense amplifier 114 receives a differential signal input over leads 115 and 116. The source of transistor 117 is coupled over lead 115 to the drain of transistors 118, 93 and 102. The source of transistor 119 is coupled over lead 116 to the drain of transistors 120, 98 and 107. The source of transistors 118 and 120 are coupled to voltage supply $V_{DD}$. The gate of transistor 118 is coupled to signal DATA IN over lead 121. The gate of transistor 120 is coupled to signal $\overline{DATA\ IN}$ over lead 122.

Sense amplifier 114 comprises P-channel transistors 117, 119 and 125–130 and N-type transistors 131–135. The source of transistors 125–130 are coupled to voltage supply $V_{DD}$. The drain of transistors 131, 134 and 135 are coupled to ground potential. The drain of transistor 117 is coupled over lead 137 to the gate of transistors 125, 131, 129 and 133 and to the drain of transistors 126, 132, and 128. The drain of transistors 125 and 131 are coupled over lead 138 to the gate of transistor 117. The gate of transistor 126 is coupled over lead 139 to the gate of transistors 132, 130 and 135 and to the drain of transistors 127, 129, 133 and 119. Control signal DETECT ENABLE is coupled over lead 140 to the gate of transistors 127, 128 and 134. The source of transistor 132 is coupled over lead 141 to the source of transistor 133 and the drain of transistor 134. The drain of transistor 130 is coupled over lead 142 to the drain of transistor 135 and the gate of transistor 119. The signal on lead 142 is known as DATA OUT. The signal on lead 138 is known as $\overline{DATA\ OUT}$.

Referring to FIG. 2, the schematic diagram of an address buffer circuit 145 is shown. Transistors 146–150 are P-channel, and transistors 151–160 are N-channel. Control signal $\overline{ADDRESS\ ENABLE}$ is coupled over lead 162 to the gate of transistors 150, 153 and 154. An input signal which is to be buffered such as address signal $A_i$ is coupled over line 163 to the gate of transistor 158. A reference voltage is coupled over lead 164 to the gate of transistor 160. The source of transistors 146, 149 and 150 are coupled to voltage supply $V_{DD}$. The drain of transistor 150 is coupled over line 165 to the source of transistors 147 and 148. The gate of transistor 147 is coupled over lead 166 to the gate of transistors 152, 149 and 156 and the drain of transistors 153, 148, 155 and 159. The gate of transistor 148 is coupled over lead 167 to the gate of transistors 155, 146 and 151 and the drain of transistors 147, 152, 157 and 154. The source of transistors 151–156, 158 and 160 are coupled to ground potential. The drain of transistor 146 is coupled over lead 35 to the drain of transistor 151 and the gate of transistor 157. Lead 35 carries an output signal $A_n$ which has the same logic value as the input signal $A_i$ on line 163. The drain of transistor 149 is coupled over lead 37 to the drain of transistor 156 and the gate of transistor 159. The signal on line 37 is $\overline{A_n}$ which is the complement of the logic signal $A_i$ on lead 163.

In operation of buffer circuit 145, control signal $\overline{ADDRESS\ ENABLE}$ is normally high causing transistor 150 to be non-conducting and transistors 153 and 154 to be conducting. Leads 167 and 166 are both low causing leads 35 and 37 to be high which carries signals $A_n$ and $\overline{A_n}$ respectively. When $\overline{ADDRESS\ ENABLE}$ goes low on line 162, transistor 150 becomes conducting and transistors 153 and 154 become non-conducting. The input signal $A_i$ on lead 164 causes transistor 158 to be conducting or non-conducting depending upon its logic state. The voltage $V_{REF}$ on lead 164 is adjusted midway between the logic state of signal $A_i$ such as 1.5 volts if logic signal $A_i$ is originating from transistor transistor logic (TTL). TTL may have a valid low state from 0 to 0.8 volts and a valid high state from 2.4 V to $V_{CC}$. $V_{CC}$ is typically 5 volts. Transistor 150 will conduct current either through transistor 147 or 148 to cause either lead 166 or 167 to go high which will force the other lead to stay low. The output signals on lines 35 and 37 will thus reflect the logic state of the input signal $A_i$ by $A_n$ on line 35 and the complement $\overline{A_n}$ on line 37. The input signal may now be removed on lead 163 without affecting the output on lines 35 and 37 so long as control signal $\overline{ADDRESS\ ENABLE}$ remains low. When $\overline{ADDRESS\ ENABLE}$ goes high then lines 35 and 37 will revert back to the high logic state by going to voltage $V_{DD}$.

FIG. 3 is a schematic diagram of the referenced voltage generator 170. The reference voltage is set by the voltage drop across transistor 171 which has its source coupled to lead 164 and to one side of resistor 172. Resistor 172 may be, for example 10,000 ohms and made by depositing polysilicon having a suitable resistance in ohms per square. The other side of resistor 172 is coupled to voltage $V_{CC}$. The gate and drain of transistor 171 is coupled over lead 173 to ground potential. The reference voltage $V_{REF}$ of 1.5 volts is determined by the gate-to-source voltage $V_{GS}$ across transistor 171 at the current level flowing through resistor 172. For TTL circuitry which has a low voltage state of 0.8 volts or less and a high voltage state of 2.4 volts or more, an intermediate voltage of 1.5 volts is typical for voltage $V_{REF}$.

FIG. 4 is a block diagram of a read/write buffer 175. The circuit may be the same as shown in FIG. 2 for address buffer circuit 145. In FIG. 4 $\overline{\text{ADDRESS0 ENABLE}}$ is coupled over line 162, voltage $V_{REF}$ is coupled over line 164. Control signal R is coupled over line 176. And output signals WRITE and READ are on lines 58 and 178. If the circuit of FIG. 2 is used then output lines 58 and 178 correspond to lines 37 and 35 of FIG. 2 and line 176 corresponds to line 163 in FIG. 2.

FIG. 5 is a schematic diagram of timing generator 180. In timing generator 180, transistors 182-185 are P-channel and transistors 186-189 are N-channel transistors. The source of transistors 182-185 are coupled to voltage supply $V_{DD}$. The source of transistors 186-189 are coupled to ground potential. Control signal CHIP ENABLE is coupled over lead 181 to the gate of transistors 182 and 186. The drain of transistors 182 and 186 are coupled over lead 162 to the gate of transistors 183 and 187. The drain of transistors 183 and 187 are coupled over lead 109 to the gate of transistors 184 and 188. The drain of transistors 184 and 188 are coupled over lead 190 to the gate of transistors 185 and 189. The drain of transistors 185 and 189 are coupled together over lead 140. Timing generator 180 comprises a series of inverter circuits each having a propagation delay time to provide control signals $\overline{\text{ADDRESS ENABLE}}$ on line 162, $\overline{\text{RESET}}$ on line 109 and DETECT ENABLE on line 140 which have true or complement signals and are delayed in time with respect to control signal CHIP ENABLE.

Figure 6A:
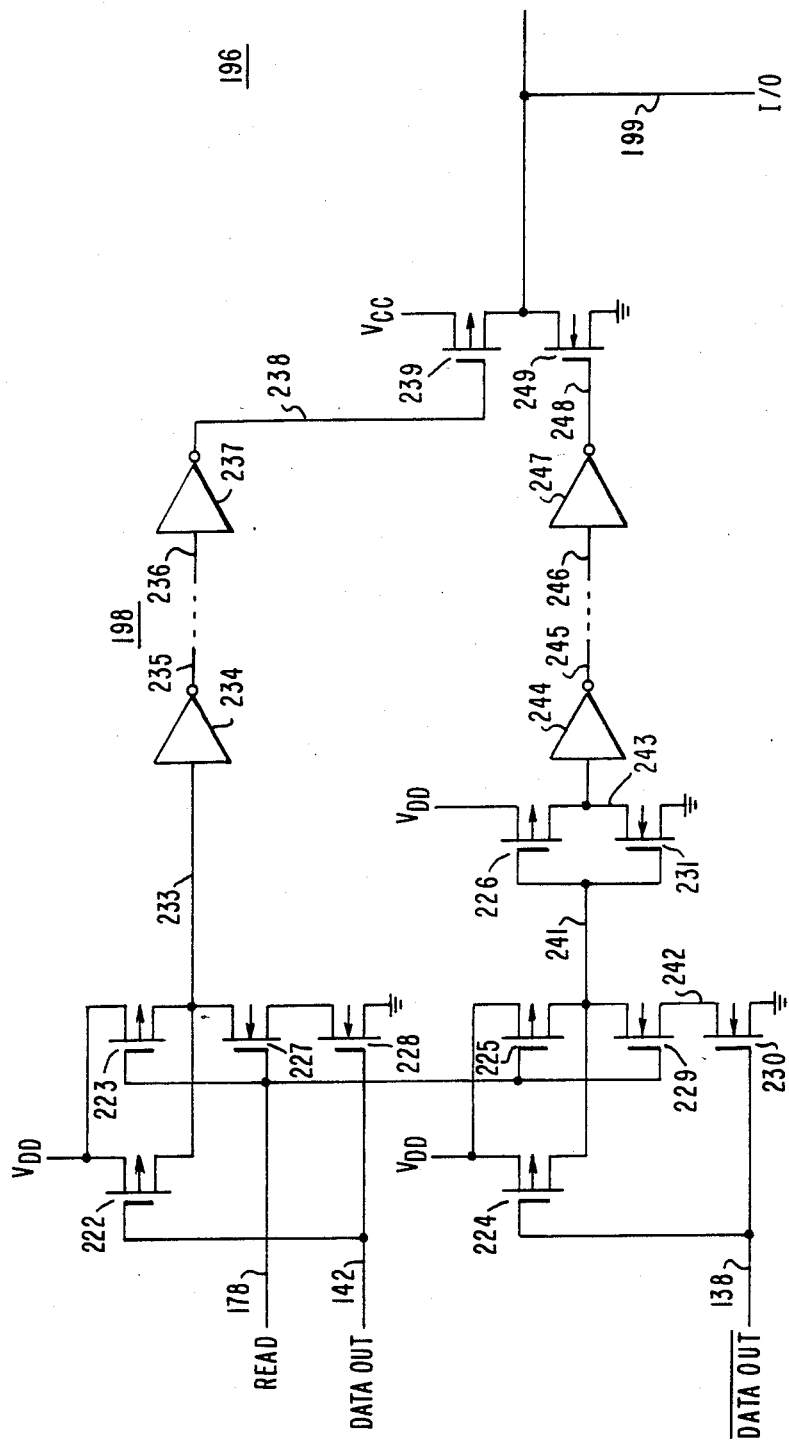
FIGS. 6A and 6B together show a schematic diagram of an input/output buffer.
Figure 6B:
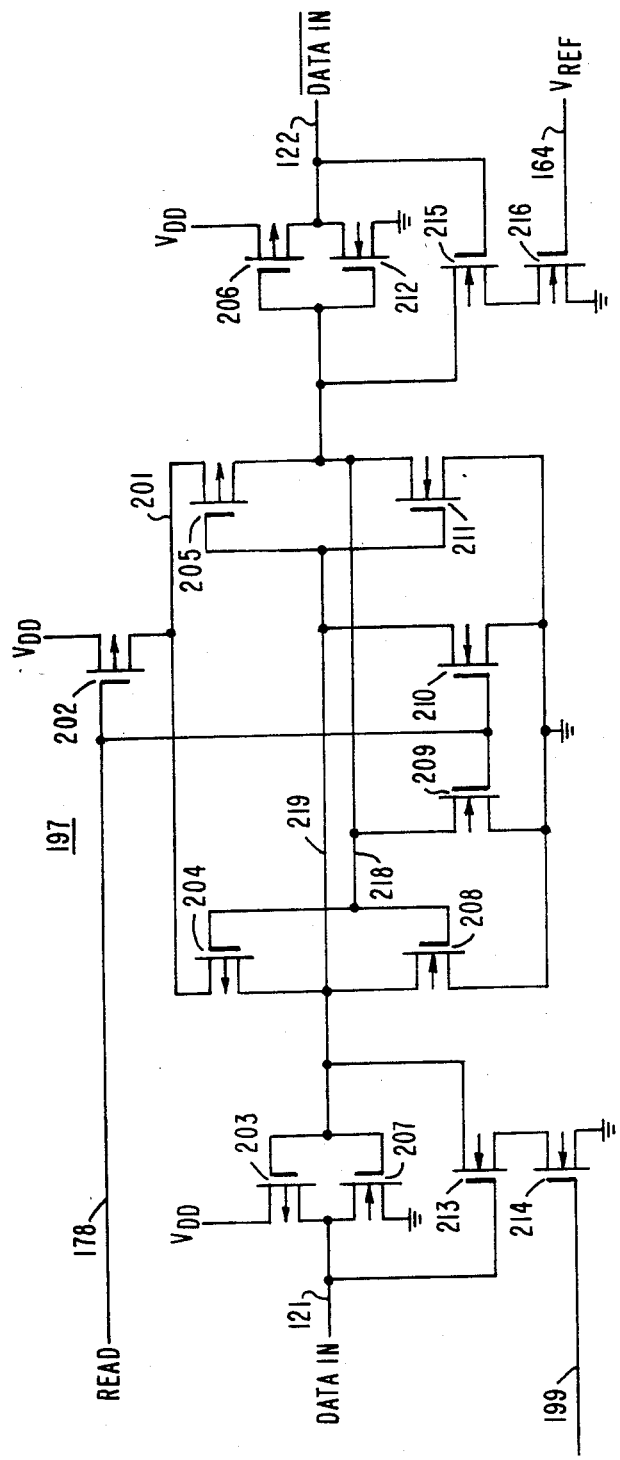

FIGS. 6A and 6B together show a schematic diagram of input/output buffer 196. Input/output buffer 196 has an input circuit 197 shown in FIG. 6B and an output circuit 198 shown in FIG. 6A. The output of output circuit 198 and the input of input circuit 197 are coupled together over line 199 to form a common bidirectional input/output terminal. Lead 199 may be replaced with two leads to form separate input and output terminals.

Input circuit 197 is similar to address buffer circuit 145 shown in FIG. 2. In FIG. 6B input circuit 197 has P-channel transistors 202-206 and N-channel transistors 207-216. The source of transistors 202, 203 and 206 are coupled to voltage supply $V_{DD}$. The source of transistors 207-212, 214 and 216 are coupled to ground potential. Control signal READ is coupled over line 178 to the gate of transistors 202, 209 and 210. The drain of transistor 209 is coupled over line 218 to the gate of transistors 204, 208, 206 and 212 and to the drain of transistors 205, 211 and 215. The drain of transistor 210 is coupled over line 219 to the gate of transistors 205, 211, 203 and 207 and to the drain of transistors 204, 208 and 213. The drain of transistor 202 is coupled over line 201 to the source of transistors 204 and 205. Signal DATA IN is coupled over line 121 to the drain of transistors 203 and 207 and to the gate of transistor 213. Signal $\overline{\text{DATA IN}}$ is coupled over line 122 to the drain of transistors 206 and 212 and to the gate source of transistor 215. The source of transistor 213 is coupled to the drain of transistor 214. The source of transistor 215 is coupled to the drain of transistor 216. Voltage $V_{REF}$ is coupled over line 164 to the gate of transistor 216. Input data is coupled over line 199 to the gate of transistor 214. Input circuit 197 at the time control signal READ goes low, holds or latches the data present on line 199.

The latched data is presented on line 121 as DATA IN and on line 122 as $\overline{\text{DATA IN}}$.

Output circuit 198 shown in FIG. 6A has P channel transistors 222-226 and 239 and N-channel transistors 227-231 and 249. The source of transistors 222-226 is coupled to voltage supply $V_{DD}$. The source of transistors 228, 230, and 231 is coupled to ground potential. Control signal READ is coupled over line 178 to the gate of transistors 223, 227, 225 and 229. Signal DATA OUT is coupled over line 142 to the gate of transistors 222 and 228. Signal $\overline{\text{DATA OUT}}$ is coupled over line 138 to the gate of transistor 224 and 230. The drain of transistors 222, 223 and 227 are coupled over line 233 to the input of inverter 234. The output of inverter 234 is coupled over line 235 through an even number of inverters each having a higher drive capability to line 236 and to the input of inverter 237. The output of inverter 237 which has the same logic signal as line 233 is coupled over line 238 to the gate of transistor 239. When control signal READ is high and signal DATA OUT is high then transistors 227 and 228 will be conducting causing line 233 to be low which will cause line 238 to be low turning on transistor 239 and pulling line 199 high to voltage $V_{CC}$.

The drain of transistor 224 is coupled to the drain of transistors 225 and 229 and to the gate of transistors 226 and 231. The source of transistor 229 is coupled over line 242 to the drain of transistor 230. The drain of transistor 226 is coupled over line 243 to the drain of transistor 231 and to an input of inverter 244. The output of inverter 244 is coupled over line 245 through an even number of inverter stages to line 246 and to the input of inverter 247. The output of inverter 247 is coupled over line 248 to the gate of transistor 249. When control signal READ is high and signal $\overline{\text{DATA OUT}}$ is high transistors 229 and 230 will be conducting causing line 241 to be low and line 243 high. With an even number of inverters used between inverters 244 and 247 line 248 will be high causing transistor 249 to conduct pulling line 199 low. Each of the successive inverters are larger to have increasing drive capability to drive the output transistors.

In operation of the electrically alterable non-volatile memory 10 shown in FIGS. 1A through 1C, the variable threshold transistors in array 12 are first cleared to one threshold state such as a low threshold state where the threshold voltage $V_T$ is in the neighborhood of 1.5 volts. In array 12, two transistors are used for each memory cell with their threshold states written in opposite directions, one high and one low. With the variable threshold transistors cleared to the low threshold state, then information is written into a memory cell by writing the high threshold state into one of the two transistors. The memory cells store a logic one or a logic zero by determining which variable threshold transistor is written to a high threshold state with respect to the sense amplifier 114.

Figure 7:
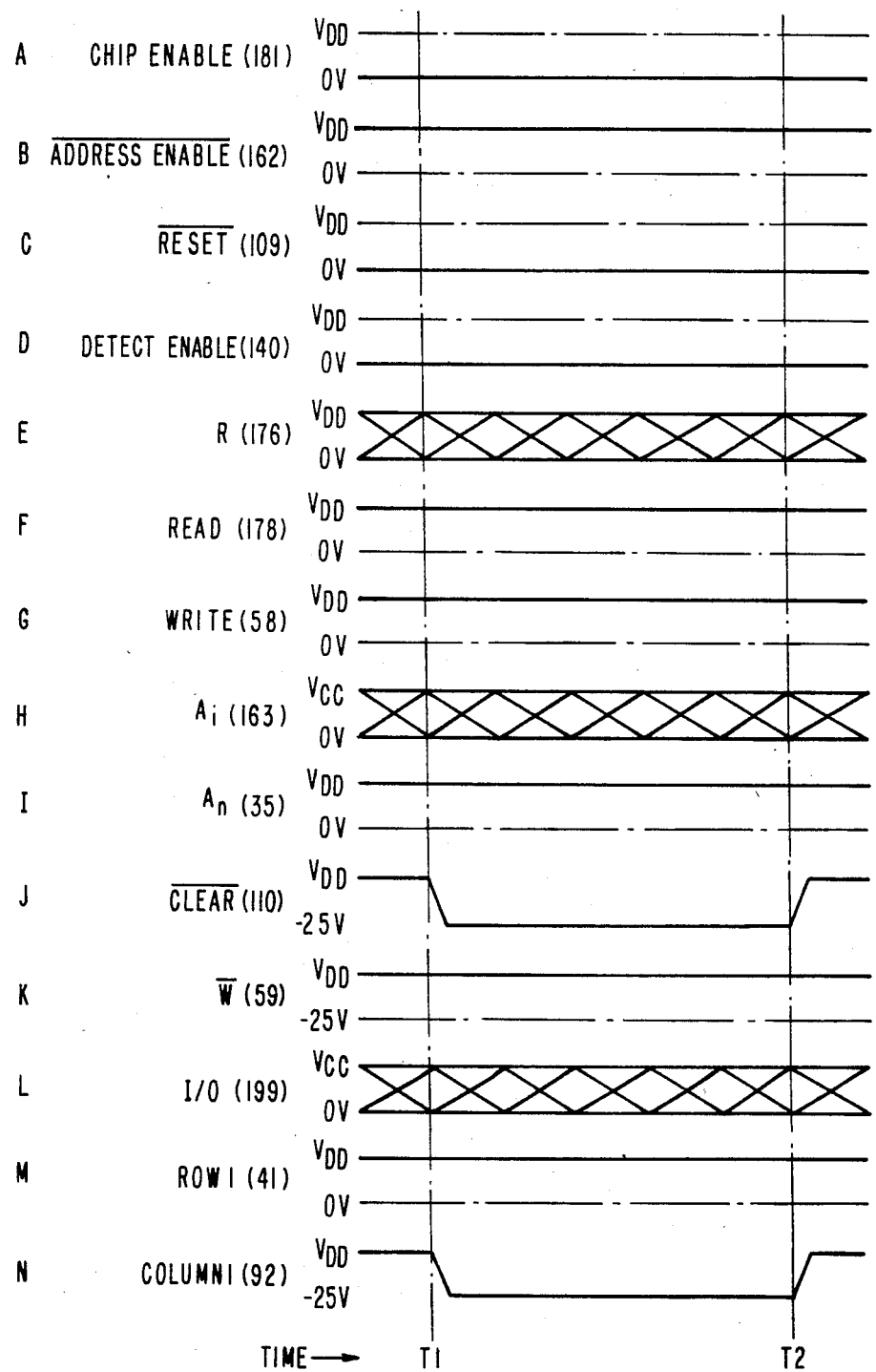
FIG. 7 shows waveforms A through N during a clear operation of the embodiment of FIG. 1.

FIG. 7 shows waveforms A through N of control signals and certain circuit nodes during a clear operation of the memory array 12 in FIGS. 1A through 1C. The circuits shown in FIGS. 2-6 are also used in conjunction with FIGS. 1A through 1C for the proper operation of the embodiment of FIGS. 1A through 1C. In FIG. 7 the ordinant represents voltage and the abscissa represents time.

Waveform A in FIG. 7 shows control signal CHIP ENABLE, which is coupled to timing generator 180 in FIG. 5, low at zero volts. Waveform B shows $\overline{\text{AD}}$ DRESS ENABLE, see FIG. 5, high at voltage $V_{DD}$. Waveform C shows control signal $\overline{\text{RESET}}$, see FIG. 5, low at zero volts. Waveform D shows control signal DETECT ENABLE, see FIG. 5, low at zero volts. Waveform E shows control signal R, see FIG. 4, either zero volts or at a voltage $V_{DD}$. Because $\overline{\text{ADDRESS ENABLE}}$ is high, control signals WRITE and READ, see FIG. 4, which is similar to FIG. 2, are also high. Waveform F shows control signal READ at voltage $V_{DD}$ and waveform G shows control signal WRITE at voltage $V_{DD}$. Waveform H shows address signal $A_i$ at either zero volts or voltage $V_{DD}$. The address signals $A_l$-$A_m$ each of which pass through an address buffer such as shown in FIG. 2 are all high due to $\overline{\text{ADDRESS ENABLE}}$ being high. Waveform 1 shows address signal $A_n$ at voltage $V_{DD}$. The other address signals $A_l$-$A_m$ are high at voltage $V_{DD}$.

With all of the address signals high, the output of ROW DECODERS 28 and 29 are low causing the output of buffers 40 and 42 to be high at voltage $V_{DD}$. Waveform M in FIG. 7 shows row 1 at voltage $V_{DD}$ which is coupled to the gates of the variable threshold transistors 14 through 17. With all of the address signals high, the output of column decoder 64 is high causing the column decode transistors such as 93, 98 to be non-conducting. Likewise the output of column decoder 68 is high causing column decode transistors 107 and 102 to be non-conducting. With control signal WRITE high transistors 80, 82, 87 and 89 are non-conducting isolating the source column lines from voltage supply $V_{DD}$. With control signal $\overline{W}$ at $V_{DD}$ shown by waveform K in FIG. 7, transistors 94, 97, 103 and 106 are non-conducting.

At time T1 control signal $\overline{\text{CLEAR}}$ shown by waveform J in FIG. 7 goes from $V_{DD}$ to $-25$ volts placing the body of every variable threshold transistor 14–21 at $-25$ volts. The gate of every variable threshold transistor is at $V_{DD}$ which may be from 5 volts to 12 volts. The voltage across the gate dielectric between the gate and body of each variable threshold transistor is therefore $V_{DD}$ plus 25 volts or plus 30 to 37 volts which is sufficient to shift the threshold voltage of every variable threshold transistor to a low state such as a threshold voltage $V_T$ of $-1.5$ volts. For the embodiment where electrically alterable non-volatile memory 10 is made on bulk silicon then the bulk silicon within dash line 53, N region 52, would be at the voltage of control signal $\overline{\text{CLEAR}}$ or $-25$ volts. Circuitry coupled to the drain or source of transistors within N region 52 shown by dash line 53 would have to withstand the voltage of control signal $\overline{\text{CLEAR}}$ of $-25$ volts as shown by waveform J in FIG. 7 during clear operation. The transistors within N region 52 if P channel would have their source and drain regions forward biased to $-25$ volts. Therefore, no transistor should be in N region 52 which has a source coupled directly to $V_{DD}$. Separate N regions electrically isolated from N region 52 should be provided, for example, by P regions therebetween. Typically the junction breakdown voltage between isolated N regions or between the drain and source region and the body of transistors is 60 volts. However, transistors having their drain or source coupled to the drain or source of transistors within N region 52 should be able to withstand at least $-25$ volts. A $V_{DS}$ of 30 volts or a $V_{PT}$ (punch through) of 30–35 volts is obtained by using transistors with a channel length of 7–10 microns. Other transistors not subject to $-25$ volts on the drain or source may have a shorter channel length such as 2 microns if $V_{DD}$ was limited to 9 volts or less. The channel length and channel impurity concentration may be optimized for high density or minimum channel length if the voltage $V_{DD}$ or the range of $V_{DD}$ is chosen.

The source and drain regions of the variable threshold transistors are forward biased when the body of the variable threshold transistors go to $-25$ volts. Waveform N in FIG. 7 shows column 1, line 92 representative of the drain and source lines going from $V_{DD}$ to $-25$ volts at time T1.

At time T2 control signal $\overline{\text{CLEAR}}$ as shown by waveform J in FIG. 7 goes from $-25$ volts to $V_{DD}$. Since control signal $\overline{\text{RESET}}$ shown by waveform C is at zero volts line 92 in column 1 is pulled from $-25$ volts to $V_{DD}$ through transistor 95.

Figure 8:
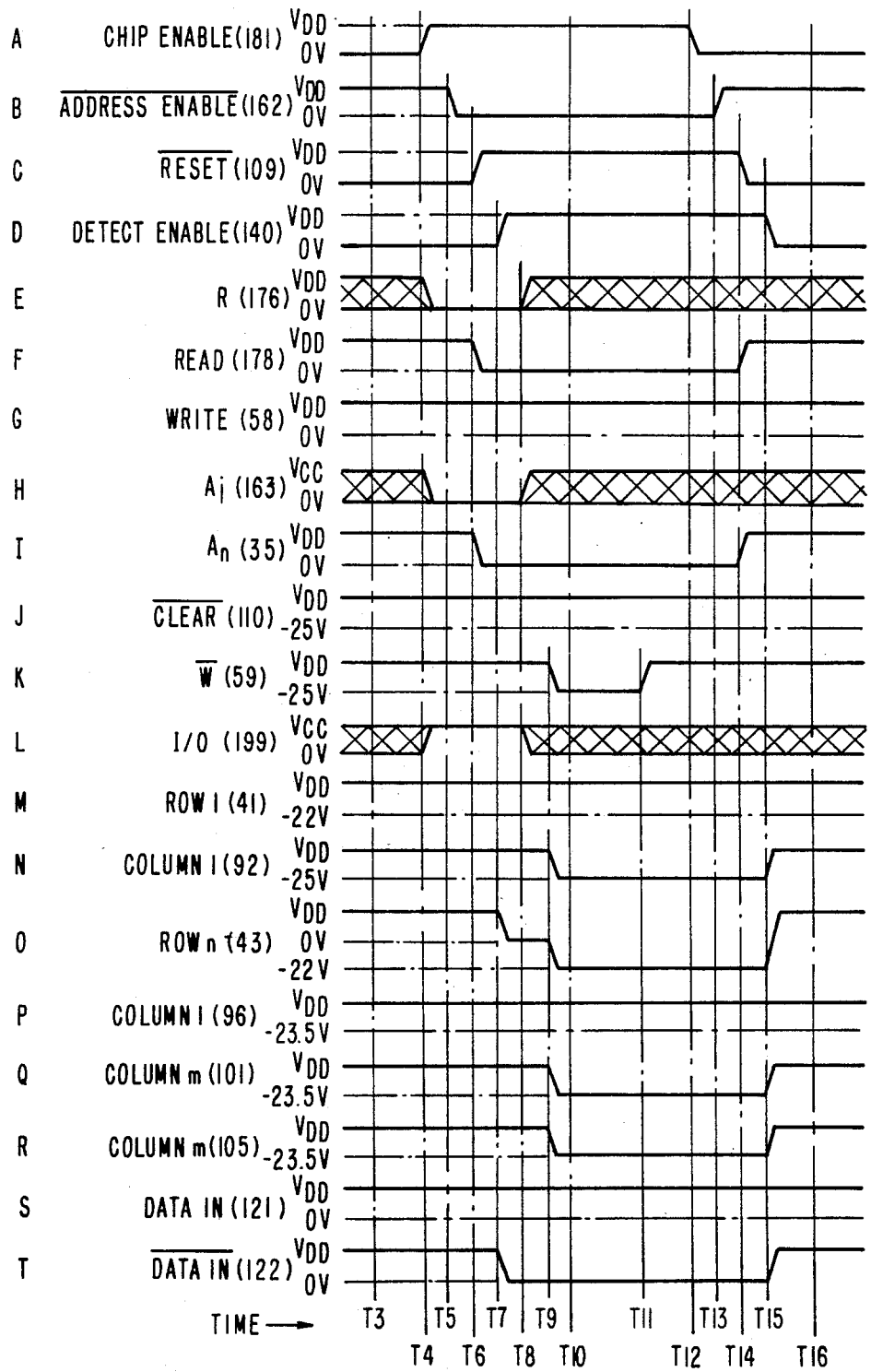
FIG. 8 shows waveforms A through T during a write operation of the embodiment of FIG. 1.

With the array of variable threshold transistors all cleared or set to a low threshold voltage, data is written into a particular bit location by placing a negative voltage on the gate which forms a channel and a positive voltage on the drain in order to place a bias voltage across the gate dielectric between the gate and channel to shift the threshold voltage from the low threshold state to the high threshold state. The high threshold state may have a threshold voltage $V_T$ of six volts. Referring to FIG. 8, waveforms A through T have been drawn to illustrate writing by changing the threshold voltage of transistor 19 in row n of column 1. By changing the threshold voltage of transistor 19 to the high state a logic 1 will be stored in memory cell 25 which when read out will provide a logic 1 on data output line 142 having a voltage $V_{DD}$. In FIG. 8 the ordinate represents voltage and the abscissa represents time. At time T3 the initial voltages in FIG. 8 are shown by waveforms A through T for control signals, data signals and pertinent circuit nodes within memory array 12. The initial voltages are based upon the utilization of the circuits in FIGS. 2–6 in combination with FIGS. 1A through 1C. At time T4 control signal CHIP ENABLE goes from zero volts to $V_{DD}$ as shown in FIG. 8 by waveform A.

Prior to time T4 control signal R shown by waveform E could be either zero volts or voltage $V_{DD}$. At time T4 control signal R should be low or go low to zero volts indicating that a READ operation is to be performed. Address signal $A_i$ shown by waveform H can either be at zero volts or at voltage $V_{CC}$ prior to time T4. At time T4 the appropriate address state should be settled to determine the address of the word to be written into. As shown by waveform H, address $A_i$ went to zero volts. The input data signal to be written at the proper address is carried on signal line I/O as shown by waveform L. At time T4 the proper logic state for the data should be settled and as shown by waveform L is at voltage $V_{CC}$.

At time T5, control signal $\overline{\text{ADDRESS ENABLE}}$ goes low in response to control signal CHIP ENABLE going high at time T4 by the circuitry shown in FIG. 5. At time T6, control signal $\overline{\text{RESET}}$ goes high in response to control signal $\overline{\text{ADDRESS ENABLE}}$ going low by way of the circuitry of FIG. 5. Control signal $\overline{\text{RESET}}$ is shown by waveform C in FIG. 8.

Also at time T6 control signal READ shown by waveform F goes low in response to $\overline{\text{ADDRESS ENABLE}}$ going low at time T5 when control signal R is low by way of the circuitry of FIG. 4. Control signal WRITE on line 58 shown by waveform G stays high at the output of READ/WRITE buffer 175 shown in FIG. 4.

Also at time T6 all of the addresses such as address $A_m$ shown by waveform I go to the correct logic state in response to $\overline{\text{ADDRESS ENABLE}}$ which went low at time T5. The logic state of address signal $A_i$ is low. The circuitry of FIG. 2 causes signal $A_n$ to go low at time T6.

At time T7 control signal DETECT ENABLE shown by waveform D in FIG. 8 goes high in response to control signal $\overline{\text{RESET}}$ going high at time T6 by way of the circuitry of FIG. 5. Also data time T7 row decoders 28 and 29 have decoded the addresses presented to it such as addresses $A_i$-$A_m$. If the addresses are decoded to select row n then the output of row decoder 29 will go high and row n, line 43, through array 12 will go to 0 volts as shown by waveform O. Since row 1 was not decoded, the output of row decoder 28 will remain low and the output of buffer 40 will remain high causing row 1, line 41, to remain high at voltage $V_{DD}$ as shown by waveform M. All rows through array 12 except the one decoded row will remain high.

When control signal READ went low at time T6 as shown by waveform F in FIG. 8, the data on line 199 to input circuit 197 shown in FIG. 6 is sampled. Waveform L shows the I/O data on line 199 to be sampled by input circuit 197 and waveforms S and T show the output of input circuit 197 at time T7 which holds the input data to be written in the selected memory cell 25. $\overline{\text{DATA IN}}$ goes low at time T7 causing transistor 120 to conduct, holding column 1 line 96 at voltage $V_{DD}$ as shown by waveform P. Transistor 118 remains non-conducting in response to DATA IN remaining high.

At time T8 control signal R may be either high or low since its logic state was stored in READ/WRITE buffer 175. At time T8 address signals $A_i$ may assume either high or low state since the address signals are stored in address buffer circuits 145. It being understood that there is one address buffer circuit 145 for each address bit. At time T8 the data on signal I/O shown by waveform L in FIG. 8 may assume high or low state since the logic state of the data has been stored in input circuit 197 shown in FIG. 6.

At time T9 control signal $\overline{W}$ goes from $V_{DD}$ to $-25$ volts as shown by waveform K in FIG. 8. Referring to buffer 42, transistors 45 and 47 will be off since the voltage on line 36 is high. Transistor 45 will be off. Transistor 48 will be conducting pulling line 57 low causing transistor 49 to be conducting which will pull row n, line 43, to the voltage of control signal $\overline{W}$, $-25$ volts less the $V_T$ of transistors 48 and 49. Diode 55 prevents current being drawn through transistor 50 which is conducting from ground potential. The voltage of row n, line 43, is thus pulled to $-25$ volts less the $V_T$ of transistors 48 and 49 at time T9 as shown by waveform O in FIG. 8. Row 1, line 41, which was not selected remains at voltage $V_{DD}$ as shown by waveform M. The voltage on row 1 is controlled by buffer 40 which may have similar circuitry as buffer 42. The input line 38 is low causing its transistor 45 to remain conducting keeping row 1 at voltage $V_{DD}$. Buffer 40 would have its transistor 50 non-conducting and transistor 47 conducting which pulls line 57 high even though transistor 48 is conducting some current to line 59. Transistor 49 would therefore be non-conducting preventing control signal $\overline{W}$ on line 59 from pulling row 1, line 41 to $-25$ volts.

Referring to FIG. 1 when $\overline{W}$ goes to $-25$ volts transistors 94 and 97 conduct some current tending to pull column one lines 92 and 96 low. In addition column decoder 64 has the appropriate addresses to select column one to be the column to be written in and line 67 goes low causing transistors 93 and 98 to conduct. At the time DETECT ENABLE goes high at time T7 transistor 120 was conducting pulling line 116 to $V_{DD}$ causing sense amplifier 114 to set with DATA OUT on line 142 low and $\overline{\text{DATA OUT}}$ on line 138 high causing transistor 117 to be non-conducting and transistor 119 to be conducting. Transistor 94 will therefore pull column one line 92 low at time T9 even though transistor 93 is conducting since line 115 is isolated since transistors 117 and 118 are non-conducting.

At time T9 when $\overline{W}$ goes to $-25$ volts transistor 97 will try to pull line 96 of column one low but will be unable to since transistor 98 is conducting and since transistors 120 and 119 and 129 are conducting keeping line 96 of column 1 at $V_{DD}$ as shown by waveform P in FIG. 8.

Column m which was non-selected has the output of its column decoder 68 high causing transistor 107 and 102 to be non-conducting. At time T9 when $\overline{W}$ goes to $-25$ volts, transistors 103 and 106 are conducting pulling column M lines 101 and 105 to $-23.5$ volts as shown by waveforms Q and R in FIG. 8.

At time T10 the voltages within array 12 are correct for writing a high threshold state in transistor 19 of column 1 since the drain via line 96 is at voltage $V_{DD}$ and the gate via line 43 is at $-22$ volts. The gate of transistor 18 is also at $-22$ volts while its drain via line 92 is at $-23.5$ volts. The channel formed in transistor 18 is at $-20.5$ volts while the channel formed in transistor 19 is at voltage $V_{DD}$.

The gate of transistors 20 and 21 of memory cell 26 are also at $-22$ volts while the drain of transistor 20 through column line 101 is at $-23.5$ volts and the drain of transistor 21 through column line 105 is at $-23.5$ volts. The channel formed in transistors 20 and 21 is at the potential of its drain or $-20.5$ volts. Thus in row n only transistor 19 has a polarizing voltage across it while transistors 18, 20 and 21 have no polarizing voltage placed across them.

The voltage on the gate of transistors 14, 15, 16 and 17 is at voltage $V_{DD}$ by way of line 41 of row one. Since the gate voltage is at voltage $V_{DD}$ no channel is formed in transistors 14-17. The voltage across the gate dielectric is between the body and gate. The voltage of the body is the voltage of $\overline{\text{CLEAR}}$ which is at $V_{DD}$. Both body and gate are at $V_{DD}$.

The voltage of the drain of transistors 14-17 are of no affect. The voltage of the source lines within array 12 are isolated from $V_{DD}$ since transistors 80, 82, 87 and 89 are non-conducting. The source lines may be at a voltage as determined by the conducting transistors 18, 20 and 21 through its channel which will cause the source to follow the drain voltage less $V_T$. The source of transistor 19 with line 81 will be the same as line 96, $V_{DD}$.

At time T11 control signal $\overline{W}$ shown by waveform K in FIG. 8 will go from $-25$ volts to $V_{DD}$. The voltages within array 12 on the drain, source and gate lines will remain unchanged or drift slightly due to leakage current since transistors 49, 94, 97, 103 and 106 will go from a conducting state to a non-conducting state at time T11. At time T12 control signal CHIP ENABLE shown by waveform A goes from $V_{DD}$ to zero volts. At time T13 $\overline{\text{ADDRESS ENABLE}}$ shown by waveform B goes from zero volts to voltage $V_{DD}$.

At time T14 in response to $\overline{\text{ADDRESS ENABLE}}$ going high, control signal READ shown by waveform F in FIG. 8 will go from zero volts to voltage $V_{DD}$ and control signal $A_n$ shown by waveform I will go from zero volts to voltage $V_{DD}$. Also $\overline{RESET}$ shown by waveform C will go from voltage $V_{DD}$ to zero volts.

At time T15 in response to control signal $\overline{RESET}$, transistors 95, 99, 104 and 108 will be conducting in memory array 12 pulling column lines 92, 96 101 and 105 to $V_{DD}$, the voltage of control signal $\overline{CLEAR}$.

Also at time T15 control signal DETECT ENABLE shown by waveform D in FIG. 8 goes from voltage $V_{DD}$ to zero volts causing transistors 126 and 129 in sense amplifier 114 to be non-conducting and transistors 131 and 135 to be conducting. At time T15 in response to control signal READ, signals DATA IN and $\overline{DATA\ IN}$, see FIG. 6, will go to voltage $V_{DD}$ as shown by waveforms S and T in FIG. 8. Also at time T15 in response to all address signals going to voltage $V_{DD}$ the output of column decoder 64 and 68 will be high at voltage $V_{DD}$ causing transistors 93, 98, 102 and 107 to be non-conducting. At time T16 the voltages in array 12 have returned to the same levels as at time T3 prior to the WRITE cycle.

Figure 9:
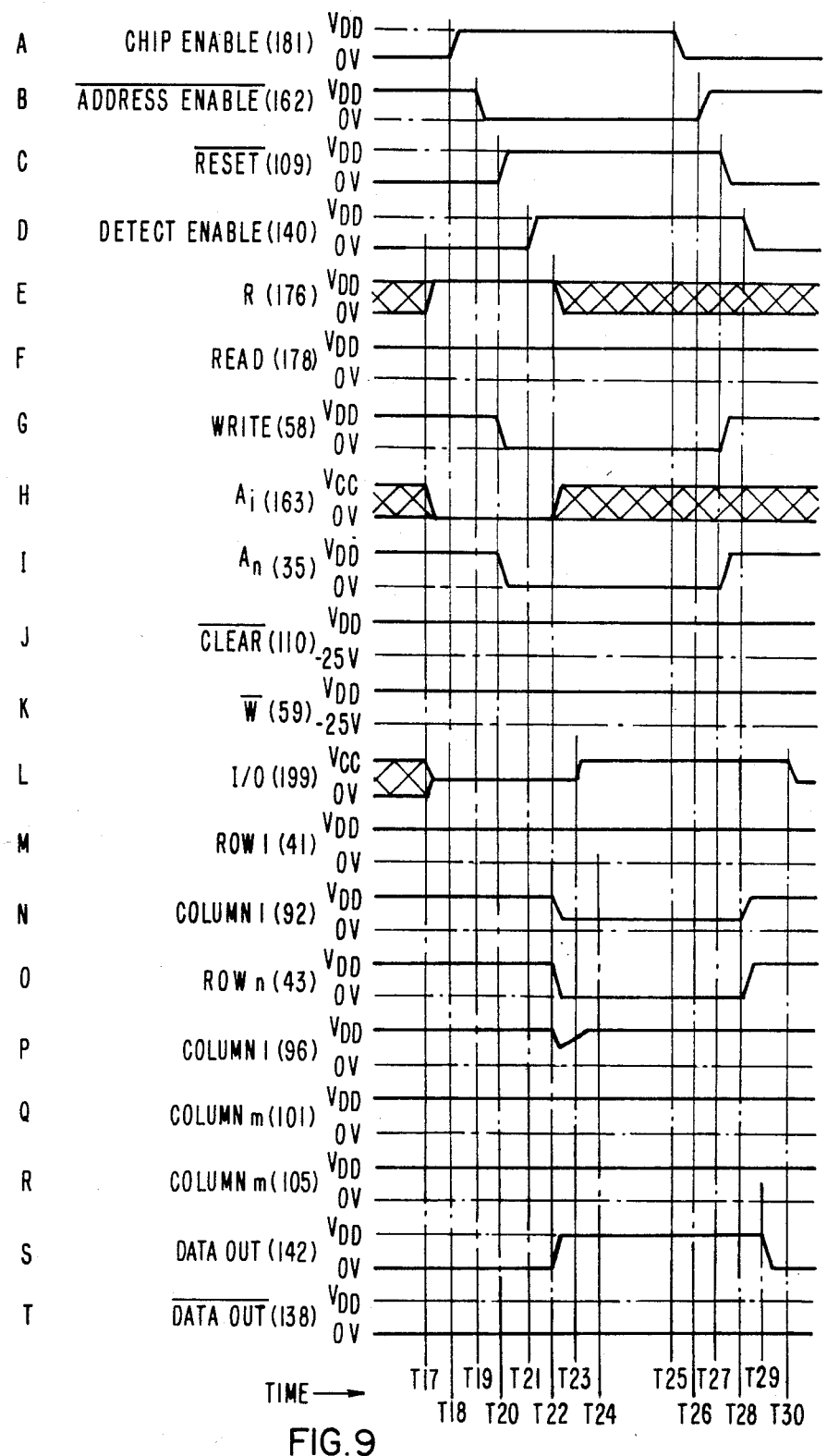
FIG. 9 shows waveforms A through T during a read operation of the embodiment of FIG. 1.

Referring to FIG. 9, waveforms A through T are shown of control signals and certain circuit nodes for the proper operation of the embodiment of FIG. 1 for reading or retrieving information from array 12. In FIG. 9 the ordinate represents voltage and the abscissa represents time. At time T17 control signal R shown by waveform E should be settled to the high state at voltage $V_{DD}$ indicating a READ operation is about to occur. At time T17 the address signals $A_i$ shown by waveform H should be settled to show the proper address for retrieving or reading information from array 12. At time T17 signal I/O shown by waveform L should be floating. Since I/O is a bidirectional bus with input data travelling one way and output data travelling the other, the floating condition indicates that input data from an external source has been removed from the bidirectional line, line 199.

At time T18 control signal CHIP ENABLE shown by waveform A in FIG. 9 goes from zero to voltage $V_{DD}$.

At time T19 control signal $\overline{ADDRESS\ ENABLE}$ shown by waveform B in FIG. 9 goes from voltage $V_{DD}$ to zero volts. At time T20 control signal $\overline{RESET}$ shown by waveform C goes from zero volts to voltage $V_{DD}$. Also, control signal WRITE shown by waveform G goes from voltage $V_{DD}$ to zero volts by action of READ/WRITE buffer 175 shown in FIG. 4. Control signal READ shown by waveform F stays at voltage $V_{DD}$ by action of READ/WRITE buffer 175. Also at time T20 all the address signals such as address signal $A_n$ shown by waveform I assumes their true values high or low depending upon the particular address. For example if we want to read memory cell 25 then the addresses are such that row decoder 29 will have a high output causing transistor 50 in buffer 42 to conduct pulling row n, line 43, to 0 volts as shown by waveform O in FIG. 9 at time T21. Row decoder 28 will be non-selected causing line 38 to be low and the output of buffer 40 to be high at voltage $V_{DD}$. The output of column decoder 64 will be low causing transistors 93 and 98 to conduct. The output of column decoder 68 will be high causing transistors 102 and 107 to be non-conducting.

At time T20 control signal WRITE goes to zero volts as shown by waveform G in FIG. 9 causing transistors 80, 82, 87 and 89 to conduct pulling the source lines to voltage $V_{DD}$. Control signal WRITE also causes transistor 46 in buffer 42 to be conducting assuring that the gate of transistor 49 is high causing transistor 49 to be non-conducting.

At time T21 when row n goes to 0 volts as shown by waveform O in FIG. 9, transistors 18 and 19 are conducting. Lines 92 and 96 of column one remain at voltage $V_{DD}$ by conducting transistors 117, 119, 127, 128, 80 and 92 to $V_{DD}$ as shown by waveforms N and P in FIG. 9. Also transistors 20 and 21 in column m begin conducting at time T21. Lines 101 and 105 of column m remain at voltage $V_{DD}$ by conducting transistors 87 and 89 as shown by waveforms Q and R in FIG. 9.

During READ operation the gate to source voltage $V_{GS}$ on the decoded row is 0 volts minus $V_{DD}$. Voltage $V_{DD}$ may be in the range from 5 to 12 volts. In response to control signal DETECT ENABLE going high at time T22, amplifier 114 senses the relative currents on lines 115 and 116 by conducting current through transistors 117, 132 and 134 and through transistors 119, 133 and 134. Sense amplifier 114 will latch to the sense line supplying the most current such as line 115 which will cause voltage node 137 to go high and voltage node 139 to go low causing the output on line 142 to go high. When line 142 goes high, transistor 119 will be non-conducting shutting off the current from line 116 allowing node 139 to drop in voltage faster towards zero volts. With signal DATA OUT on line 142 high as shown by waveform S in FIG. 9, the output circuit 198 shown in FIG. 6 will cause transistor 239 to be conducting pulling signal I/O on line 199 high at time T23 as shown by waveform L in FIG. 9.

At time T25 control signal CHIP ENABLE shown by waveform A in FIG. 9 goes to zero volts causing control signal $\overline{ADDRESS\ ENABLE}$ shown by waveform B to go to voltage $V_{DD}$ at time T26. Control signal WRITE shown by waveform G goes to voltage $V_{DD}$ at time T27. Address signals such as $A_n$ shown by waveform I go to voltage $V_{DD}$ at time T27. Also at time T27 control signal $\overline{RESET}$ shown by waveform C goes to zero volts.

At time T28 the voltage on line 43 of row n goes to voltage $V_{DD}$ in response to all address signals going to voltage $V_{DD}$ at time T27.

At time T28 in response to all address signals going to voltage $V_{DD}$ at time T27, the output of column decoders 64 and 68 go to voltage $V_{DD}$ causing transistors 94, 97, 103 and 106 to be non-conducting. With transistors 94 and 97 non-conducting, lines 92 and 96 of column 1 are isolated from lines 115 and 116 of sense amplifier 114.

At time T28, column one line 92 goes to $V_{DD}$ and line 96 stays at voltage $V_{DD}$ as shown by waveforms N and P in response to control signal $\overline{RESET}$ going to zero volts at time T27. Transistors 95, 99, 104 and 108 in array 12 are conducting. Likewise lines 101 and 105 of column M go to +5 volts as shown by waveforms Q and R. Also at time T28 control signal DETECT ENABLE goes to zero volts as shown by waveform D causing sense amplifier 114 to reset and forcing signals DATA OUT and $\overline{DATA\ OUT}$ to zero volts at time T29. At time T30 signal I/O on line 199 goes from voltage $V_{CC}$ to a floating condition since transistor 239 will be non-conducting.

It is to be noted that during READ operation the highest voltages in array 12 and in all the circuitry of FIGS. 1A–6, which may be in the range from 5 to 12 volts. Waveforms A through T in FIG. 9 show that during READ operation $V_{DD}$ is the highest voltage used. The lowest voltage is zero volts or ground potential. Furthermore during READ operation, the addresses such as $A_i$ shown by waveform H in FIG. 9 and the output data I/O on line 199 shown by waveform L are TTL compatible in that the voltage $V_{CC}$ may be +5 volts while voltage $V_{DD}$ may be in the range from 5 to 12 volts.

During READ operation the variable threshold transistors in array 12 are operated in a common source mode with the source of each variable threshold transistor coupled to voltage $V_{DD}$ through transistor 80, 82, 87 or 89. The selected gate row voltage goes from $V_{DD}$ volts to 0 volts such as shown in FIG. 9O which provides a constant negative gate bias $V_{GS}$ of 0 volts minus $V_{DD}$. With variable threshold MNOS transistors, any time a negative bias voltage is applied to the gate ($V_{GS}$ is some negative voltage) during READ operation, the condition is called READ DISTURB. The primary advantage of operating the variable threshold transistors in the common source mode is that with a constant $V_{GS}$ the variable threshold transistor acts as a current source providing more current to be detected. The higher current can charge circuit nodes in the array faster, resulting in earlier detection by the sense amplifier during READ operation.

In the prior art, an array of variable threshold transistors was operated during READ operation as a source follower with the drain set to a negative voltage. The source potential of the variable threshold transistor would follow the gate bias by a voltage at least $V_T$ more positive than the gate voltage. The source follower mode give a varying gate to source bias as $V_{GS}$ is decreasing as the source voltage is being pulled down to $V_T$ above the gate voltage. A smaller $V_{GS}$ results in a smaller current passing through the variable threshold transistor which results in a longer time for discharging circuit nodes in array 12 and for detection by a sense amplifier.

The effects of $V_T$ of MNOS variable threshold transistors from READ DISTURB arising from the common source read out configuration has been evaluated. The results are summarized in Table 1.

MNOS memory field affect transistors were fabricated using the drain source protected structure having a fixed threshold region adjacent the source and drain and a variable threshold region therebetween due to thin oxide layer. During test No. 1 20 volts was placed on the gate while the drain, source and substrate were grounded. The threshold voltage $V_T$ was measured immediately following removal of the +20 volts. The +20 volts was applied for one minute. During test 2 −20 volts was applied to the gate while the drain, source and substrate were grounded for one minute of time with the threshold voltage $V_T$ measured immediately upon removal of the −20 volts. These two tests provide an indication of the range of the threshold voltage $V_T$. During test 3 +20 was again applied to the gate for one minute, the threshold voltage was measured immediately read thereafter. During test 4 −5 volts was placed on the gate for one minute while the drain source and substrate were grounded. Measurement of the threshold voltage $V_T$ was made immediately upon removal of the −5 volts. As shown in Table 1 the threshold voltage $V_T$ shifted from 3.2 volts to 3.8 volts for transistor No. 1, from 2.9 volts to 3.2 volts for transistor No. 2 and from 4.4 volts to 5.6 volts for transistor No. 3. The duration of one minute for the application of the READ DISTURB voltage corresponds to 1.2 times $10^8$ read cycles where the read time per cycle was 500 nanoseconds which is a typical read time. Prior to applying the READ DISTURB voltage in tests 5–14, the variable threshold transistor had +20 volts applied to the gate while the drain source and substrate were grounded to reset the threshold voltage to the high conductance state. In tests 5–14 the READ DISTURB voltage was applied for one minute followed by measuring the threshold voltage $V_T$ immediately upon removal of the READ DISTURB voltage.

From Table 1 it can be seen that for $V_{DD}$ at 5 volts very little READ DISTURB or shift in threshold voltage takes place for transistors 1, 2 and 3 with shifts of 0.6 V, 0.3 V and 1.2 V, respectively as shown by the data in test number 4. Even if $V_{DD}$ was 15 volts a shift takes place in threshold voltage of 5.5 V, 5.8 V and 5.2 V for transistors 1, 2 and 3, respectively as shown by the data in test number 14. If the low conductance memory state is written at −25 V in test number 16, then a 1.7 V, 1.3 V and 52 V window exists between the high conductance state with a read disturb voltage of −15 V as shown in test number 14 and the low conductance state of transistors 1, 2 and 3, respectively for date detection.

TABLE 1

| Test Number | Read Disturb Voltage ($V_{GS}$) | Transistor 1 $V_T$ | | Transistor 2 $V_T$ | | Transistor 3 $V_T$ | |
|---|---|---|---|---|---|---|---|
| | | Initial | Final | Initial | Final | Initial | Final |
| 1 | +20 V | | 3.2 V | | 2.9 V | | 4.4 V |
| 2 | −20 | 3.2 V | 9.4 | 2.9 V | 9.8 | 4.4 V | 12.8 |
| 3 | +20 | 9.4 | 3.2 | 9.8 | 2.9 | 12.8 | 4.4 |
| 4 | −5 | 3.2 | 3.8 | 2.9 | 3.2 | 4.4 | 5.6 |
| 5 | −6 | 3.2 | 4.5 | — | — | — | — |
| 6 | −7 | 3.2 | 5.2 | — | — | — | — |
| 7 | −8 | 3.2 | 5.7 | — | — | — | — |
| 8 | −9 | 3.2 | 6.3 | — | — | — | — |
| 9 | −10 | 3.2 | 6.7 | 2.9 | 6.2 | 4.4 | 6.1 |
| 10 | −11 | 3.2 | 7.2 | — | — | — | — |
| 11 | −12 | 3.2 | 7.7 | 2.9 | 7.2 | 4.4 | 7.2 |
| 12 | −13 | 3.2 | 8.1 | — | — | — | — |
| 13 | −14 | 3.2 | 8.4 | — | — | — | — |
| 14 | −15 | 3.2 | 8.7 | 2.9 | 8.7 | 4.4 | 9.6 |
| 15 | +25 | 8.7 | 3.2 | 8.7 | 2.8 | 9.6 | 4.5 |
| 16 | −25 | 3.2 | 10.4 | 2.8 | 10.0 | 4.5 | 14.8 |

Therefore adequate retention times such as for $1.2 \times 10^8$ cycles can be obtained using the common source configuration as shown in array 12 of FIGS. 1A through 1C with the greatest retention being available with the lower voltages for $V_{DD}$ such as five volts.

The results in Table 1 seem quite adequate for many applications and could be improved upon by both process and circuit changes. Processing improvement can be realized by tailoring the variable threshold transistor gate dielectric for minimization of the read disturb effect. In addition, since the detection circuitry is of the lock out variety, once the latch is set in sense amplifier 114, the read disturb or memory gate voltage may be removed by forcing the decoded row line high. The row line can be forced high using control signal $\overline{\text{AD}}$ $\overline{\text{DRESS ENABLE}}$ to generate a control signal ADDRESS ENABLE 2 shown in FIG. 10 which is fed to the address buffer circuits and goes from zero volts to $V_{DD}$ earlier than $\overline{\text{ADDRESS ENABLE}}$. The shortened time period of ADDRESS ENABLE 2 would provide a lower duty cycle for read disturb.

Figure 10:
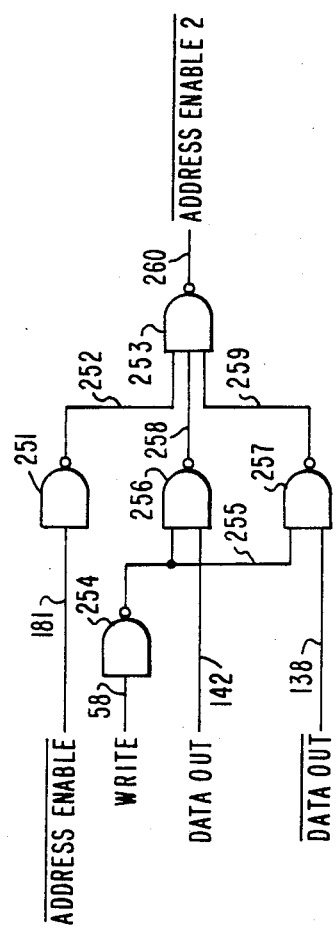
FIG. 10 shows a schematic circuit for modifying a control signal.

FIG. 10 shows a schematic circuit for use with FIGS. 1A, 1B, 1C, 4 and 5 to provide a shortened control signal ADDRESS ENABLE 2 which when substituted in place of $\overline{\text{ADDRESS ENABLE}}$ at the address buffer circuits results in early restoration of the decoded row line during READ operation to voltage $V_{DD}$ after sense amplifier 114 has latched.

Control signal $\overline{\text{ADDRESS ENABLE}}$ is coupled over lead 181 to an input of NAND gate 251. The output of NAND gate 251 is coupled over line 252 to a first input of NAND gate 253. Control signal WRITE is coupled over lead 58 to an input of NAND gate 254. The output of NAND gate 254 is coupled over lead 255 to a first input of NAND gate 256 and a first input of NAND gate 257. Signal $\overline{\text{DATA OUT}}$ is coupled over lead 2142 to a second input of NAND gate 256. The output of NAND gate 256 is coupled over lead 258 to a second input of NAND gate 253. Signal DATA OUT is coupled over lead 138 to a second input of NAND gate 257. The output of NAND gate 257 is coupled over lead 259 to a third input of NAND gate 253. The output of NAND gate 253 is coupled to lead 260 and is control signal ADDRESS ENABLE 2.

In operation during READ operation as shown in FIG. 9, control signal WRITE is high and signal DATA OUT and $\overline{\text{DATA OUT}}$ are low at time T17 causing the output of NAND gates 256 and 257 to be high. $\overline{\text{ADDRESS ENABLE}}$ is high at time T17 causing the output of gate 251 to be low and the output of gate 253 to be high. At time T19 $\overline{\text{ADDRESS ENABLE}}$ goes low causing the output of gate 251 to go high and the output of gate 253, ADDRESS ENABLE 2 to go low. At time T20 control signal WRITE goes low causing the output of gate 257 to go high. At time T22, the signal DATA OUT goes high causing the output of gate 256 to go low causing the output of gate 253, ADDRESS ENABLE 2 to go high. At time T26 $\overline{\text{AD}}$ $\overline{\text{DRESS ENABLE}}$ goes high causing the output of gate 251 to go low which keeps the output of gate 253 high. The output of sense amplifier 114 through its signals DATA OUT AND $\overline{\text{DATA OUT}}$ are used to determine the time period when control signal ADDRESS ENABLE 2 is low from T19 to T22. When ADDRESS ENABLE 2 goes high at T22 the outputs of the address buffer circuits goes high at time T23. Row n would be deselected and go high at time T24 instead of T28.

During WRITE operation, control signal WRITE is high continually enabling $\overline{\text{ADDRESS ENABLE}}$ to pass through gates 251 and 253 to be ADDRESS ENABLE 2 without any shortening with respect to $\overline{\text{ADDRESS}}$ $\overline{\text{ENABLE}}$.

While two transistors per memory cell was described and shown in FIGS. 1A through 1C, one transistor per memory cell may be used by coupling one side of sense amplifier 114 to the drain of a selected transistor by way of line 115 and the other side of sense amplifier 114 to a dummy load 123 on line 116. A dummy load 123 coupled to line 116, the source of transistor 119, may be, for example, a resistor coupled to a potential or a transistor 120 with its gate coupled over line 122 to a reference voltage $V_{REF2}$ as shown in FIG. 11C.

Figure 11B:
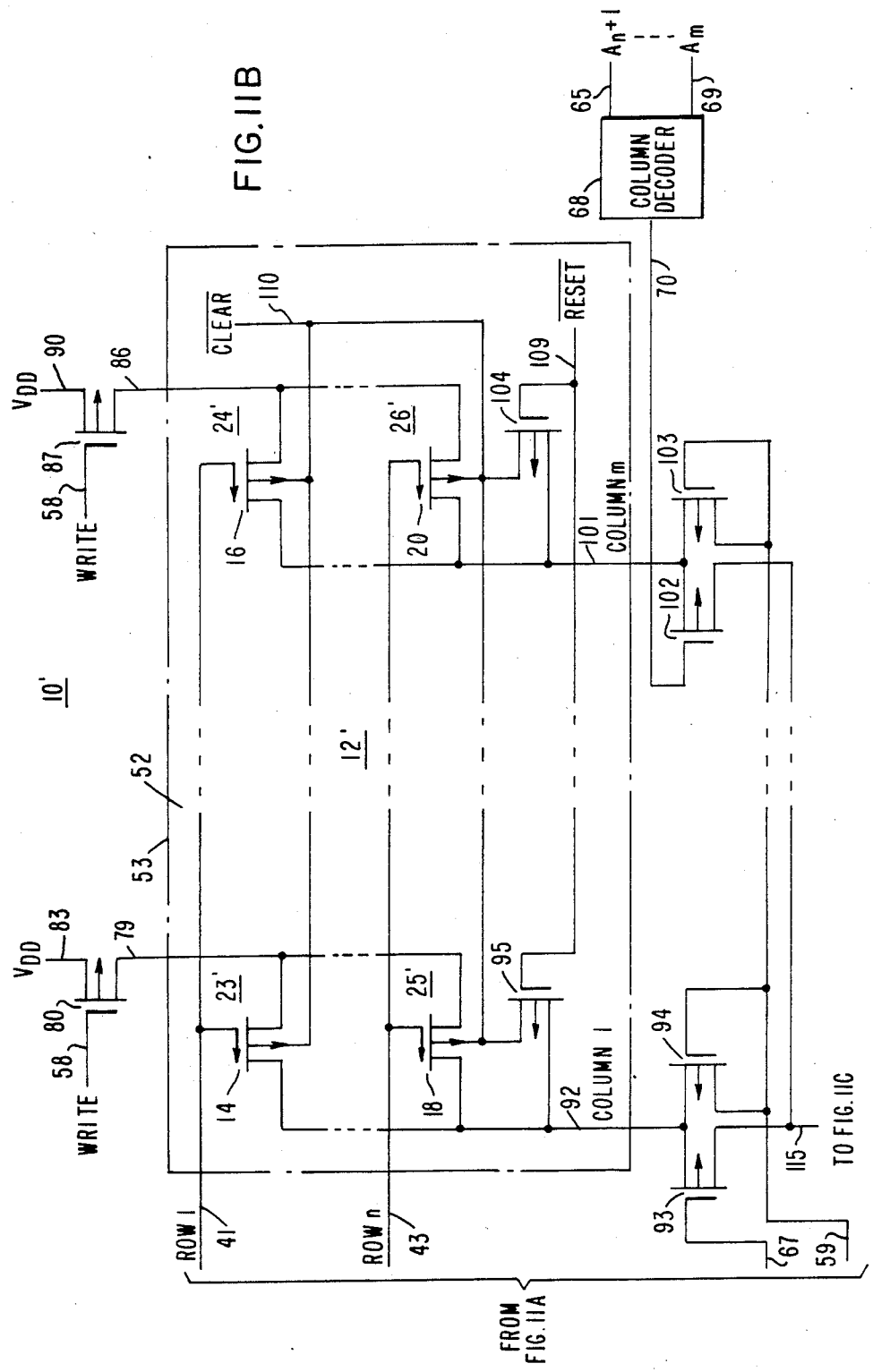
Figure 11C:
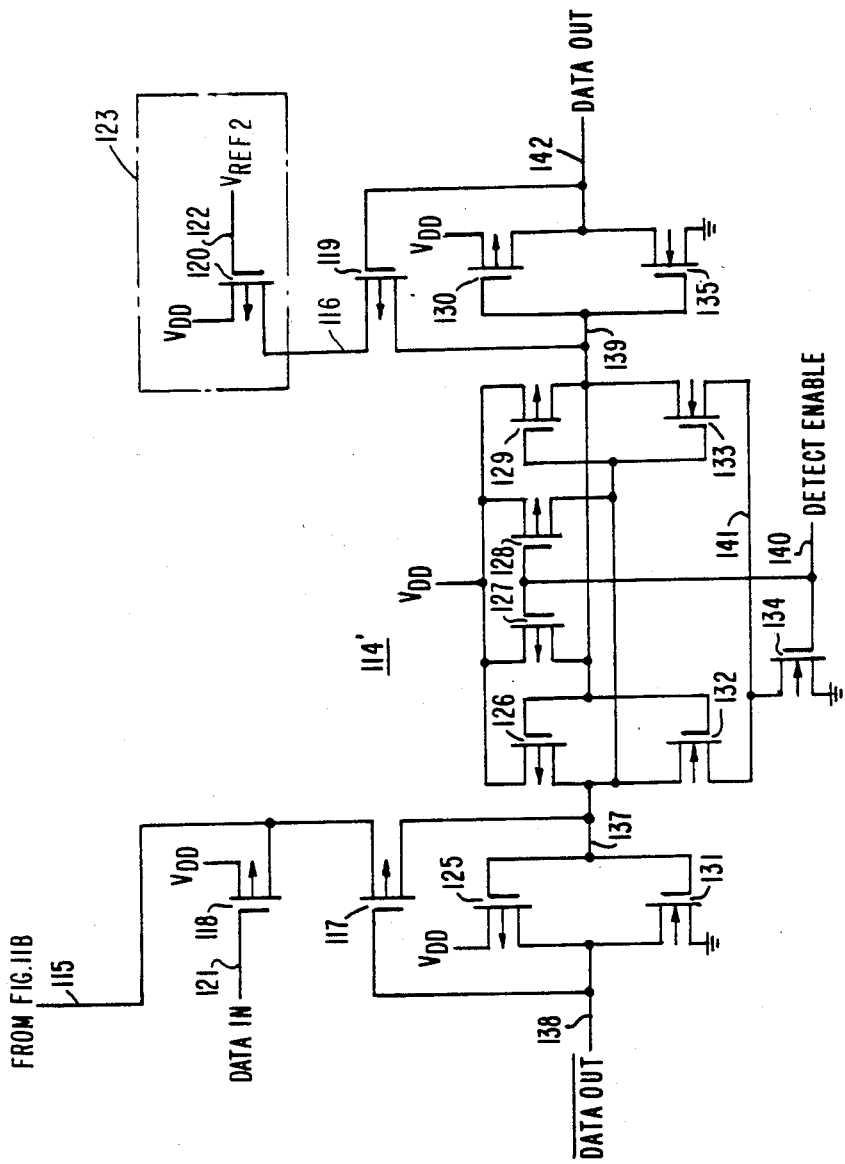

FIGS. 11A, 11B and 11C show a non-volatile memory 10' with one transistor per memory cell 23' through 26'.

Figure 12:
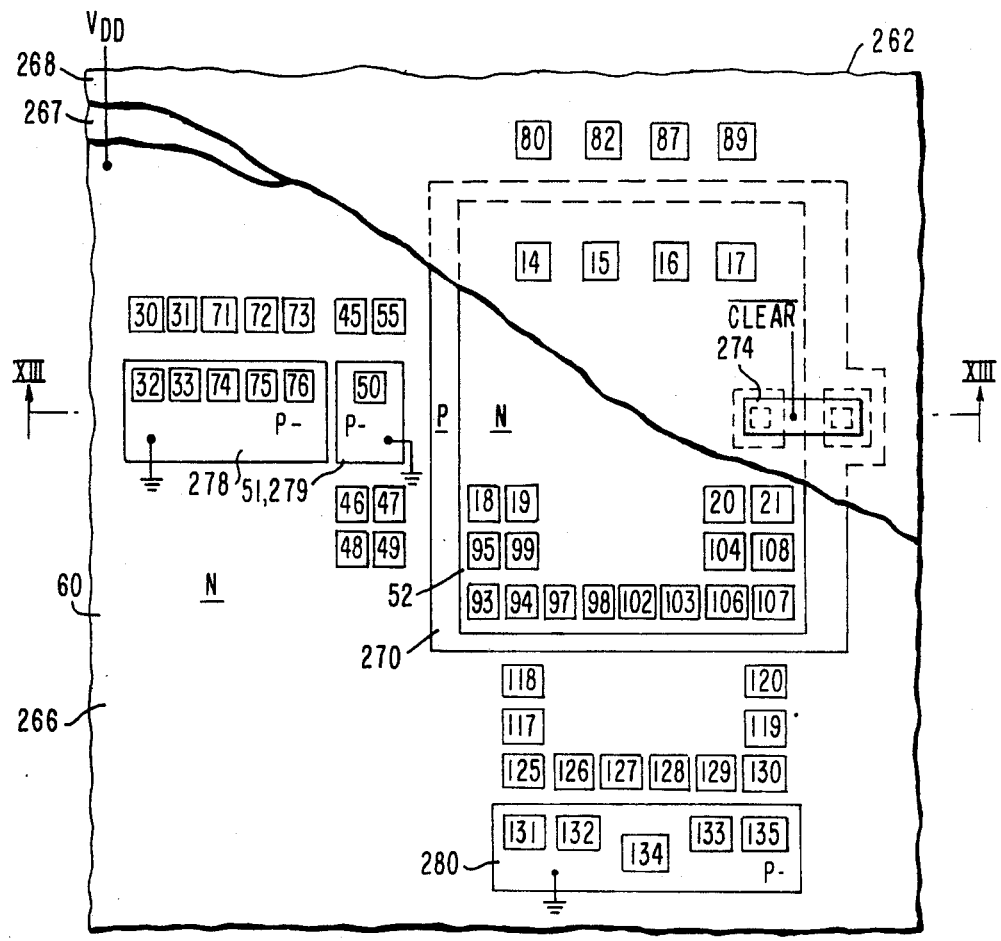
FIG. 12 is a plan view of a portion of a semiconductor chip showing N and P type regions for the transistors of the embodiment of FIGS. 1A, 1B and 1C.
Figure 13:
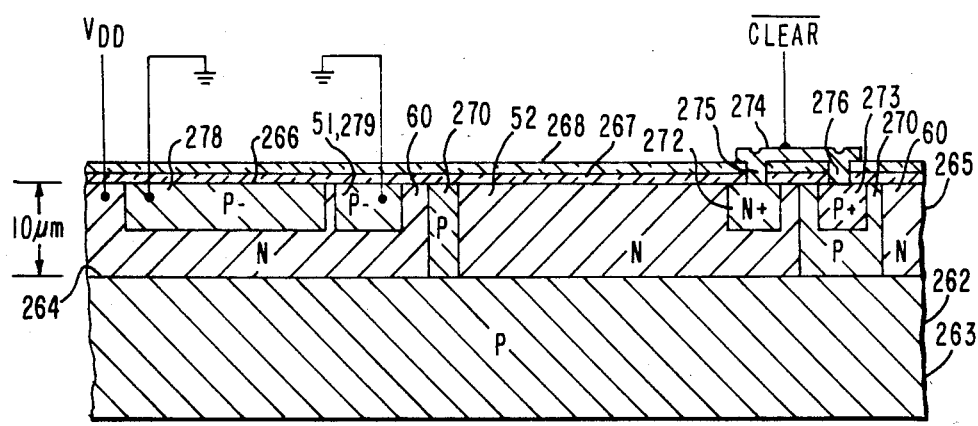
FIG. 13 is a cross-section view along the line XIII—XIII of FIG. 12.

FIG. 12 is a plan view of a portion of a semiconductor chip 262. FIG. 12 is a cross-section view along the lines XIII—XIII of FIG. 12. FIGS. 12 and 13 show N and P type regions for hosting or locating N and P type transistors and the variable threshold transistors used to implement the circuitry of the embodiment in FIGS. 1A, 1B and 1C. Semiconductor chip 262 may, for example, comprise a substrate of P type material 263 having an upper surface 264. Over surface 264 is an epitaxial layer 265 of N type material which may be, for example, 10 micrometers thick. Epitaxial layer 265 has an upper surface 266. Over upper surface 266 may be a layer of silicon dioxide 267 and a layer of silicon nitride 268 shown in FIG. 13. N region 52 is formed isolated from N region 60, both of which may be a part of epitaxial layer 265, by a P type region 270 which encloses region 52. The P type region 270 may be formed by ion implantation or by diffusion of impurities and extends from upper surface 266 through upper surface 264 of substrate 263 to insure isolation of N region 52. N+ region 272 is formed in the upper surface 266 of N region 52. P+ region 273 is formed in the upper surface 266 of P region 270. Ohmic contact is made by conductive layer 274 to N+ region 272 and P+ region 273 by way of openings 275 and 276, respectively. Conductive layer 274 is coupled to control signal $\overline{\text{CLEAR}}$ which is at voltage $V_{DD}$ except for times during CLEAR operation when control signal $\overline{\text{CLEAR}}$ goes to −25 volts.

Variable threshold transistors 14 through 21 are positioned in N region 52 and transistors 93 through 94, 97 through 99, 102 through 104 and 106 through 108 may also be located in N region 52 or they may be located in N region 60. N region 60 is coupled to potential $V_{DD}$ which is the most positive voltage. N region 60 may contain transistors 80, 82, 87 and 89, which have their source coupled to voltage $V_{DD}$ shown in FIG. 1B. Transistors having their source coupled to voltage $V_{DD}$ must be located in region 60 to prevent forward biasing of the source to body junction at times control signal $\overline{\text{CLEAR}}$ pulls region 52 to −25 volts. The complementary row decoders 28 and 29 as well as column decoder 64 shown in FIG. 1A may have their P channel transistors located in N region 60 and their N channel transistors located in a P− region 278. Region 278 has an ohmic contact to ground potential may be formed by a P type diffusion into N region 60. A second P type diffusion 279 is formed in N region 60 to hold transistor 50 of buffer 42. P− region 279 is in ohmic contact with ground potential. The other transistors which are P type of buffer 42 may be positioned in N region 60.

The transistors associated with sense amplifier 114 which are P channel may be located in N region 60. The transistors of sense amplifier 114 which are N channel may be located in P− region 280. P− region 280 is in ohmic contact with a ground potential. If silicon on an insulating substrate such as sapphire, aluminum oxide, etc. is desired instead of bulk silicon, then islands may be formed corresponding with N region 52, N region 60 and P regions 278 through 280 which are isolated from one another by spacing such as by etching to form isolated islands on the sapphire. In addition, individual islands may be formed for each transistor or plurality of transistors as the designer may choose for silicon on sapphire implementation.

An electrically alterable non-volatile memory has been described wherein an array of variable threshold transistors may be written into having minimum circuitry in addition to the array of variable threshold transistors subjected to high voltages such as −25 volts. Low voltage circuitry of the complementary metal oxide semiconductor type is described for the address decoder, column decoder and sense amplifier. During READ operation the maximum voltage applied to any of the circuitry is voltage $V_{DD}$ which may be in the range from +5 to 12 volts.

A unique row buffer circuit is described which provides high WRITE voltages to array 12 while coupled to low voltage CMOS circuitry of the address decoders.

A sense amplifier is described having an internal latch and a lock out or disconnect circuitry to facilitate speed of the sense amp.

A method of reading array 12 is provided by operating the variable threshold transistors in array 12 in a common source made to provide a constant voltage $V_{GS}$ to the transistors of the selected row for reading to provide maximum current through the selected transistors for sensing. The adverse affect of READ DISTURB on the transistors which are in the high conductance state are assessed and shown not to be a limiting factor if the voltage $V_{DD}$ is kept low during READ operation.

I claim:

1. A non-volatile memory for storing and retrieving information comprising:

an array of variable threshold transistors, each one of said transistors having a gate, source, drain and body, said variable threshold transistors arranged in a plurality of rows and at least one column, said gate of said variable threshold transistors in each row coupled together, said source of said variable threshold transistor in each column coupled together, said drain of said transistors in each said column coupled together, and said body of said variable threshold transistors in said array coupled together and electrically isolated to permit application of positive and negative voltages between the gate and body of said variable threshold transistors in said array;

first means having an input and an output for varying the threshold voltage of said variable threshold transistors in said array between first and second states by application of a positive voltage between the gate and body of at least one transistor to place the transistor in said first state and by application of a negative voltage between the gate and body of the transistor to place the transistor in said second state;

second means for retrieving information from said array including:

third means for applying a first predetermined voltage to the source and body of said transistors in at least one column;

fourth means for applying a second predetermined voltage to the gate of said transistors in a selected row, and for applying a third predetermined voltage to the gate of said transistors in non-selected rows;

said second voltage spaced from said first voltage to provide a predetermined $V_{GS}$ across said transistors in said selected row;

fifth means for sensing coupled to the drain of said transistors in at least said one column for sensing the current passing through said transistors in said selected row; and sixth means for removing said second predetermined voltage from the gate of said transistors of a selected row in response to a signal from said fifth means for sensing.

2. The non-volatile memory of claim 1 further including a plurality of buffer circuits, with one of said buffer circuits functionally positioned between said first means and each row of said array, each one of said buffer circuits having an output coupled to the gate of each transistor in the particular row to which said buffer circuit is functionally positioned between, each one of said buffer circuits responsive to the output of said first means and to WRITE control signals to provide a fourth predetermined voltage for shifting the threshold voltage of transistors in said particular row.

3. The non-volatile memory of claim 1 wherein said variable threshold transistors are P channel and wherein said first predetermined voltage is positive with respect to said second predetermined voltage.

4. The non-volatile memory of claim 3 wherein said first predetermined voltage and said third predetermined voltage are substantially the same.

5. A method for retrieving information from an array of variable threshold transistors, each one of said transistors having a gate, source, drain and body, said variable threshold transistors arranged in a plurality of rows and at least one column, said gate of said transistors in each row coupled together, said source of said transistors in each column coupled together, said drain of said transistors in each said column coupled together, said body of said transistors in said array coupled together, said method comprising the steps of:

selecting a row in said array in response to address signals, applying a first predetermined voltage to the gate of said transistors in non-selected rows, applying a second predetermined voltage to the gate of said transistors in said selected row, applying a third predetermined voltage to the source of said transistors in at least one column, applying a fourth predetermined voltage to the drain of said transistors in at least said one column, sensing the current passing through the transistor of said array which is included in said one column and in said selected row, and generating a signal upon sensing said current and removing said second predetermined voltage from the gate of said transistors of a selected row in response to said signal.

6. The method of claim 5 wherein said variable threshold transistors are P channel and wherein said third predetermined voltage is positive with respect to said second predetermined voltage.

7. The method of claim 6 wherein said first predetermined voltage and said third predetermined voltage are substantially the same.

8. A non-volatile memory for storing and retrieving information and being capable of read, write and clear operations, said memory comprising an array of P channel variable threshold transistors, each one of said transistors having a gate, source, drain and body, said variable threshold transistors arranged in a plurality of rows and at least one column.

said gate of said transistors in each row coupled together through a level shift circuit to a row decoder, said source of said transistors in each column coupled together through a first switch to a first voltage, said drain of said transistors in each column coupled together through a second switch to a write control signal and through a third switch to a sense amplifier, said body of said transistors in said array coupled together to the potential of said first voltage at times during read operation and write operation and to a second voltage at times during clear operation, said body of said transistors in said array electrically isolated from the body of transistors in said level shift circuit, row decoder, first, second and third switches, and said sense amplifier, said level shift circuit being responsive to a write control signal and to said row decoder to provide a third voltage when a row is selected by said row decoder during a write operation and a fourth voltage when a row is selected by said row decoder during a read operation.

9. The non-volatile memory of claim 8 wherein said level shift circuit includes:

first through fifth P channel field effect transistors each having a gate, drain and source, a sixth field effect transistor of the N channel type, the source of said first, second and third transistors coupled to a first voltage supply, an input lead adapted for coupling to an output of said row decoder and coupled to the gate of said first, third and sixth transistor, the drain of said first transistor coupled to an output lead adapted for coupling to one row of said array and coupled to the anode of a diode having its cathode coupled to the drain of said sixth transistor, the source of said sixth transistor coupled to ground, the gate of said second transistor adapted for coupling to a first control signal, the drain of said second and thrid transistor coupled to the source of said fourth transistor and the gate of said fifth transistor, the drain of said fifth transistor coupled to the gate and drain of said fourth transistor and adapted for coupling to a second control signal, the source of said fifth transistor coupled to said drain of said first transistor.

10. The non-volatile memory of claim 8 wherein said row decoder includes a complementary metal oxide semiconductor circuit.

11. The non-volatile memory of claim 8 wherein said sense amplifier includes a complementary metal oxide semiconductor circuit.

12. The non-volatile memory of claim 8 wherein said first, second and third switches each include a field effect transistor.

13. The non-volatile memory of claim 8 further including first means coupled to said sense amplifier and to said row decoder for terminating a read operation by deactivating said row decoder in response to a signal from said sense amplifier.

14. The non-volatile memory of claim 8 wherein said sense amplifier includes:

first through eighth P channel transistors each having a gate, source and drain, ninth through thirteenth N channel transistors each having a gate, source and drain, the source of said first, third through sixth, and eighth transistors coupled to a first voltage, the source of said ninth, eleventh and thirteenth transistors coupled to ground potential, the gate of said fourth, fifth and eleventh transistors adapted for coupling to a control signal, the gate of said first transistor is coupled to the gate of said sixth, ninth and twelfth transistors and to the drain of said second, third, fifth and tenth transistors, the gate of said eighth transistor is coupled to the gate of said third, tenth and thirteenth transistors and to the drain of said fourth, sixth, seventh and twelfth transistors, the source of said tenth transistor coupled to the source of said twelfth transistor and to the drain of said eleventh transistor, the drain of said first transistor coupled to the gate of said second transistor and to the drain of said ninth transistor, the drain of said eighth transistor coupled to the gate of said seventh transistor and to the drain of said thirteenth transistor, a first input line coupled to the source of said second transistor, and a second input line coupled to the source of said seventh transistor.

15. The non-volatile memory of claim 8 wherein said sense amplifier includes:

a first and second inverter each having an input and an output, the input of said first inverter coupled to the output of said second inverter, the input of said second inverter coupled to the output of said first inverter, first means for presetting a third predetermined voltage at the output of said first and second inverters and for enabling the outputs of said first and second inverters to assume opposite logic states with respect to each other at times during current sensing, and second means for coupling the output of said first inverter to a source of current to be sensed and for decoupling the output of said first inverter at times during current sensing when the voltage at said output of said first inverter is at a fourth predetermined voltage.

16. The non-volatile memory of claim 8 wherein said row decoder includes P channel and N channel fixed threshold field effect transistors.

17. The non-volatile memory of claim 8 wherein said sense amplifier includes P channel and N channel field effect transistors.

18. The non-volatile memory of claim 16 or 17 wherein said P channel field effect transistors are formed in an N type layer on a P type substrate and said N channel field effect transistors are formed in a P-type region formed in said N type layer.

19. The non-volatile memory of claim 8 wherein said body of said variable threshold transistors are formed in a first region of an N type layer on a P type semiconductor substrate, said first region enclosed by a P type second region extending through said N type layer.

20. The non-volatile memory of claim 19 wherein said first and second regions are coupled together by conductive material in ohmic contact with said first and second regions.

21. The non-volatile memory of claim 20 wherein said row decoder includes P channel fixed threshold field effect transistors formed in a third region of said N type layer outside said first region and N channel fixed threshold field effect transistors formed in a P type fourth region formed in said third region.

* * * * *